US009754874B2

(12) United States Patent
Yen et al.

(10) Patent No.: US 9,754,874 B2
(45) Date of Patent: Sep. 5, 2017

(54) INDUCTIVE CAPACITIVE STRUCTURE AND METHOD OF MAKING THE SAME

(71) Applicant: TAIWAN SEMICONDUCTOR MANUFACTURING COMPANY, LTD., Hsinchu (TW)

(72) Inventors: Hsiao-Tsung Yen, Tainan (TW); Cheng-Wei Luo, Hsinchu (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 177 days.

(21) Appl. No.: 14/062,924

(22) Filed: Oct. 25, 2013

(65) Prior Publication Data

US 2015/0115402 A1 Apr. 30, 2015

(51) Int. Cl.

| | |
|---|---|
| ***H01L 21/8234*** | (2006.01) |
| ***H01L 21/8244*** | (2006.01) |
| ***H01L 23/522*** | (2006.01) |
| ***H01L 21/822*** | (2006.01) |
| ***H01L 23/66*** | (2006.01) |
| ***H01L 27/06*** | (2006.01) |
| ***H01L 25/065*** | (2006.01) |

(52) U.S. Cl.

CPC ...... *H01L 23/5227* (2013.01); *H01L 21/8221* (2013.01); *H01L 23/5223* (2013.01); *H01L 23/5225* (2013.01); *H01L 23/5226* (2013.01); *H01L 23/66* (2013.01); *H01L 25/065* (2013.01); *H01L 27/0694* (2013.01); *H01L 2223/6622* (2013.01); *H01L 2924/0002* (2013.01)

(58) Field of Classification Search

CPC ........... H01L 21/0228; H01L 21/26556; H01L 21/28194; H01L 21/2807; H01L 21/02529; H01L 31/1812; H01L 27/1203; H01L 27/0805; H01L 27/0251; H01L 27/0629; H01L 29/435; H01L 29/7869; H01L 29/66045; H01L 23/5227; H01L 23/66

USPC ....... 438/238, 381, 240, 270, 252, 311, 584, 438/602, 603, 604, 606, 608, 700, 706, 438/712, 745, 680, 931, 679; 257/E21.006, E21.007, E21.082, E21.126, 257/E21.127, E21.129, E21.17, E21.218, 257/E21.229, E21.267, E21.32, E21.396, 257/E21.499, 296, 298, 300

See application file for complete search history.

(56) References Cited

U.S. PATENT DOCUMENTS

| | | | | |
|---|---|---|---|---|
| 5,329,225 | A * | 7/1994 | Roshen | H01F 6/06 323/360 |
| 6,549,258 | B1 * | 4/2003 | Shin et al. | 349/141 |
| 6,717,054 | B2 * | 4/2004 | Rolston et al. | 174/72 B |
| 7,266,867 | B2 * | 9/2007 | Shen et al. | 29/25.35 |
| 7,602,264 | B2 * | 10/2009 | Itou et al. | 333/193 |
| 7,646,440 | B2 * | 1/2010 | Cheng et al. | 349/39 |
| 8,243,030 | B2 * | 8/2012 | Jiang et al. | 345/173 |
| 2003/0147197 | A1 * | 8/2003 | Uriu | H01P 1/2039 333/185 |

* cited by examiner

*Primary Examiner* — Anthony Ho
(74) *Attorney, Agent, or Firm* — Hauptman Ham, LLP

(57) ABSTRACT

An inductive capacitive structure including a first substrate, a first conductive line over the first substrate, a first shielding layer over the first substrate and a second substrate over the first substrate.

20 Claims, 16 Drawing Sheets

INDUCTIVE CAPACITIVE STRUCTURE AND METHOD OF MAKING THE SAME

BACKGROUND

Inductors are used in circuits to help regulate current flow through the circuit. When a current flows through the inductor, energy is stored temporarily in a magnetic field in the inductor. When the current flowing through the inductor changes, a time-varying magnetic field within the inductor induces a voltage in the inductor which opposes the change in current that created the magnetic field.

As technology nodes shrink, circuit sizes are reduced. Inductors occupy a large area in a circuit design. As the circuit size decreases, proximity between the inductor or capacitor and the other devices increases. Furthermore, as metal lines in these components decrease in size, a resistance in the metal lines increases. The increased resistance in turn lowers the quality (Q) factor of the inductors. In addition, inductors cause a magnetic flux to pass through the circuit. The magnetic flux is capable of introducing noise into other devices within the circuit.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1A:
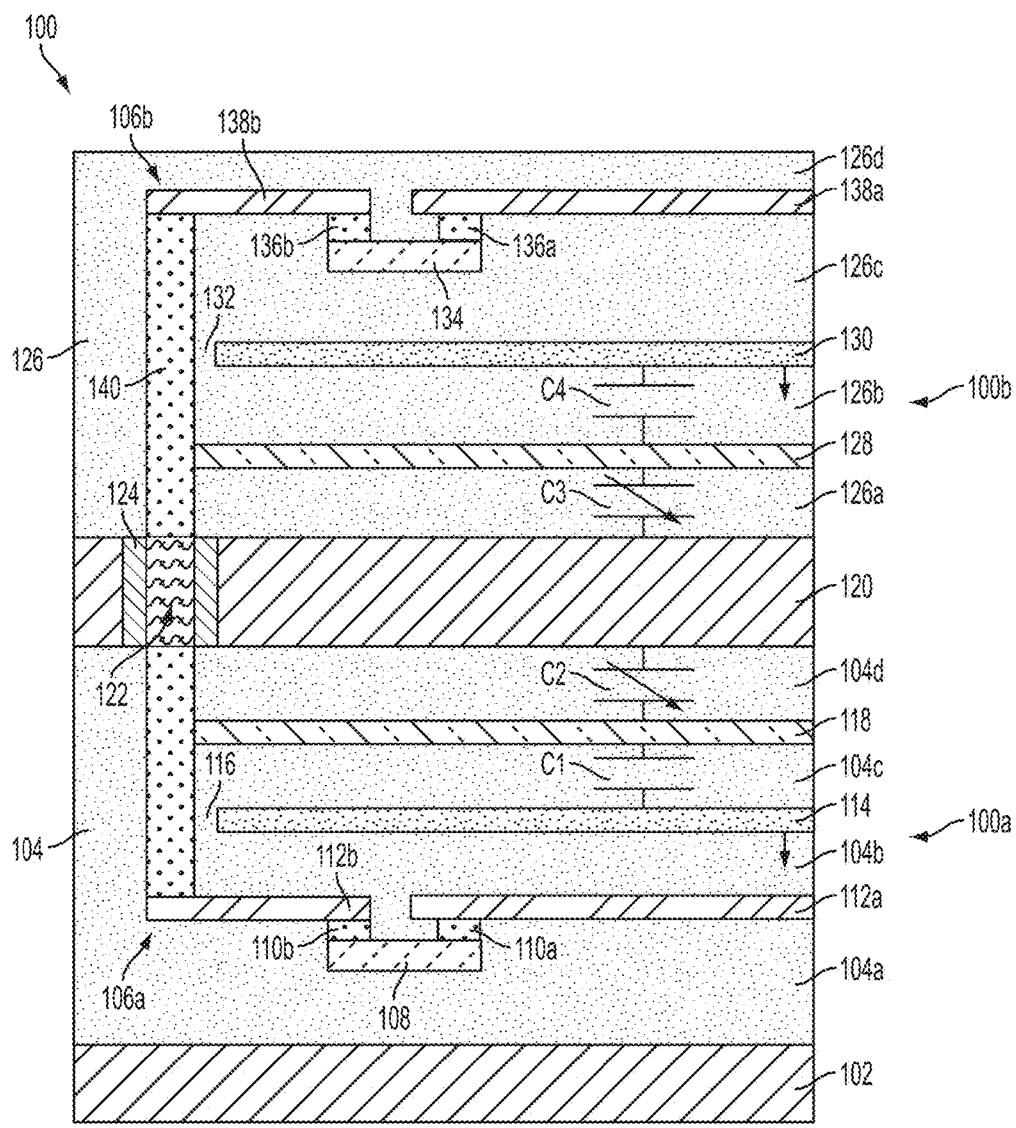
FIG. 1A is a cross sectional view of an inductive capacitive (LC) structure in accordance with one or more embodiments.

The following disclosure provides many different embodiments, or examples, for implementing different features of the disclosed subject matter. Specific examples of components and arrangements are described below to simplify the present disclosure. These are examples and are not intended to be limiting.

This description of the embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

FIG. 1A is a cross sectional view of an inductive capacitive (LC) structure 100 in accordance with one or more embodiments. LC structure 100 includes a first substrate 102, a second substrate 120, a first conductive line 106*a*, a second conductive line 106*b*, a first shielding layer 114, a second shielding layer 130, a first gate layer 118, a second gate layer 128, a switch 122, a first inter-metal dielectric (IMD) layer 104 and a second IMD layer 126. In some embodiments, LC structure 100 is in a stacked configuration with a first LC tank circuit structure 100*a* located below the second substrate 120, and a second LC tank circuit structure 100*b* located above the second substrate 120. In some embodiments, first LC tank circuit structure 100*a* and second LC tank circuit structure 100*b* operate in a differential mode. In some embodiments, first LC tank circuit structure 100*a* comprises first substrate 102, first IMD layer 104, first conductive line 106*a*, first shielding layer 114 and first gate layer 118. In some embodiments, second LC tank circuit structure 100*b* comprises second substrate 120, second IMD layer 126, second conductive line 106*b*, second shielding layer 130 and second gate layer 128.

LC structure 100 includes a first substrate 102 and a first IMD layer 104 over the first substrate 102. A first conductive line 106*a*, a first shielding layer 114 and a first gate layer 118 are each in first IMD layer 104. In some embodiments, first IMD layer 104 is a multi-layer material. In some embodiments, first IMD layer 104 comprises first IMD layers 104*a*, 104*b*, 104*c*, and 104*d*. LC structure 100 includes a first conductive line 106*a* in first IMD layer 104*a*. The first conductive line 106*a* and first IMD layer 104*a* are over the first substrate 102. LC structure 100 includes a first IMD layer 104*b* over the first conductive line 106*a* and a first shielding layer 114 in first IMD layer 104*b*. The first shielding layer 114 is over the first conductive line 106*a*. LC structure 100 includes a first IMD layer 104*c* over the first shielding layer 114 and a first gate layer 118 in first IMD layer 104*c*. The first gate layer 118 is over the first shielding layer 114. LC structure 100 includes a first recess portion 116 which connects first IMD layer 104*b* and first IMD layer 104*c*. In some embodiments, the first shielding layer 114 is separated from a conductive line 140 by the first recess portion 116. LC structure 100 includes first IMD layer 104*d* over the first gate layer 118 and a second substrate 120 over first IMD layer 104*d*.

LC structure 100 includes a second substrate 120 over first substrate 102 and first IMD layer 104. LC structure 100 includes a second IMD layer 126 over the second substrate 120. A second conductive line 106*b*, a second shielding layer 130 and a second gate layer 128 are in second IMD layer 126. In some embodiments, second IMD layer 126 is a multi-layer material. In some embodiments, second IMD layer 126 comprises second IMD layers 126*a*, 126*b*, 126*c*, and 126*d*. LC structure 100 includes a second gate layer 128 in second IMD layer 126*a*. The second gate layer 128 and second IMD layer 126*a* are over the second substrate 120. LC structure 100 includes a second IMD layer 126*b* over the second gate layer 128 and a second shielding layer 130 in second IMD layer 126*b*. The second shielding layer 130 is over the second gate layer 128. LC structure 100 includes a second IMD layer 126*c* over the second shielding layer 130 and a second conductive line 106*b* in second IMD layer 126*c*. The second conductive line 106*b* is over the second shielding layer 130. LC structure 100 includes a second recess portion 132 which connects second IMD layer 126*b* and second IMD layer 126*c*. In some embodiments, the second shielding layer 130 is separated from the conductive line 140 by the second recess portion 132. LC structure 100 includes a second IMD layer 126*d* over the second conductive line 106*b*. In some embodiments, the second IMD layer 126*d* is omitted. Conductive line 140 electrically connects first conductive line 106*a* and second conductive line 106*b* through second substrate 120. A switch 122 is formed in second substrate 120 to selectively connect different portions of first conductive line 106*a* and second conductive line 106*b*. An insulator 124 is formed in second substrate 120 to electrically isolate conductive line 140 from second substrate 120. In some embodiments, insulator 124 includes a dielectric material including oxide or another suitable insulating material.

In some embodiments, first substrate 102 includes an elemental semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, first substrate 102 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure. In some embodiments, a thickness of first substrate ranges from about 30 microns (μm) to about 50 μm.

In some embodiments, first IMD layer 104 is a multi-layer material having conductive lines extending in a plane parallel to a top surface of first substrate 102 in each layer and conductive vias connecting conductive lines on separate layers in the first IMD layer. First IMD layer 104 includes a dielectric material configured to insulate the conductive lines or conductive vias. In some embodiments, first IMD layer 104 includes an interconnect structure configured to electrically connect active devices in or on first substrate 102. In some embodiments, the dielectric material of first IMD layer 102 includes a low-k dielectric material. A low-k dielectric material has a dielectric constant less than that of silicon dioxide. In some embodiments, first IMD layer 104 comprises a plurality of layers. In some embodiments, first IMD layer 104 comprises first IMD layers 104*a*, 104*b*, 104*c*, and 104*d*. In some embodiments, first IMD layer 104 includes a dielectric material including oxide or another suitable insulating material.

First conductive line 106*a* includes conductive lines in first IMD layer 104. In some embodiments, first conductive line 106*a* is in a two-dimensional plane in first IMD layer 104. In some embodiments, first conductive line 106*a* is positioned in a two-dimensional plane which is parallel to first shielding layer 114. In some embodiments, first conductive line 106*a* is a three-dimensional structure in first IMD layer 104. The three-dimensional structure includes a combination of conductive lines on different layers of first IMD layer 104 and conductive vias connecting the conductive lines. First conductive line 106*a* includes a first straight conductive line 112*a* and a second straight conductive line 112*b* on a same level of first IMD layer 104. First conductive line 106*a* further includes a third straight conductive line 108 on a different level of first IMD layer 104. First conductive line 106*a* further includes a first conductive via 110*a* connecting first straight conductive line 112*a* to third straight conductive line 108; and a second conductive via 110*b* connecting second straight conductive line 112*b* to third straight conductive line 108. In some embodiments, first straight conductive line 112*a* and second straight conductive line 112*b* are on a level of first IMD layer 104 above third straight conductive line 108. In some embodiments, first straight conductive line 112*a* and second straight conductive line 112*b* are on a level of first IMD layer 104 below third straight conductive line 108. In some embodiments, first conductive line 106*a* includes a single port for either receiving or outputting an electrical current. In some embodiments, first conductive line 106*a* includes more than one port and is capable of both receiving and outputting an electrical current. In some embodiments, first conductive line 106*a* includes copper, aluminum, nickel, tungsten, titanium, or another suitable conductive material. In some embodiments, first conductive line is omitted and LC structure 100 includes only second conductive line 106*b*. In some embodiments, a thickness of first conductive line 106*a* ranges from about 0.1 μm to about 4 μm. In some embodiments, a depth of first straight conductive line 112*a* ranges from about 0.1 μm to about 4 μm. In some embodiments, first conductive line 106*a* includes one or more inductors with a range of inductances from about 0.5 (nanohenries) nH to about 10 nH.

In some embodiments, first conductive line 106*a* is a meandering type conductive winding in which a conductive line extends along an angled direction with respect to an x-axis and a y-axis of first IMD layer 104. Conductive lines in a same layer of first IMD layer 104 extend parallel to one another. Conductive lines in a different layer of first IMD layer 104 are arranged to allow electrical connection between the parallel conductive lines; and conductive vias connect the conductive lines on the different layers of the first IMD layer 104.

In some embodiments, first conductive line 106*a* is a spiral type conductive winding in which conductive lines are arranged in a spiral arrangement in different layers of first IMD layer 104. Conductive vias provide electrical connections between the conductive lines in the different layers of first IMD layer 104.

First shielding layer 114 includes a conductive material to isolate first conductive line 106*a* and second conductive line 106*b*. First shielding layer 114 reduces the mutual inductive coupling and capacitive coupling between first conductive line 106*a* and second conductive line 106*b*. In some embodiments, first shielding layer 114 is in a two-dimensional plane in first IMD layer 104. In some embodiments, first shielding layer 114 is a three-dimensional structure in first IMD layer 104. In some embodiments, the orientation of the first shielding layer 114 is parallel to the first conductive line 106*a* and second conductive line 106*b*. In some embodiments, the first shielding layer 114 includes a conductive plate coupled to ground. In some embodiments, the first shielding layer 114 is a solid conductor with a plate-like shape. In some embodiments, the first shielding layer 114 includes a solid conductor with hole-like portions, formed therein, shaped in various patterns, such as rectangular, square, circular, hexagonal, or other geometric shapes.

First shielding layer 114 is electrically isolated from the conductive line 140 by the first recess portion 116. First recess portion 116 has a width between about 4 μm and about 30 μm. First shielding layer 114 has a thickness between about 0.1 μm and about 2 μm. In some embodiments, the thickness of the first shielding layer 114 is larger or smaller depending on design requirements for the LC structure 100. A larger thickness will provide greater protection from mutual inductive coupling and capacitive coupling. A smaller thickness will reduce the protection from mutual inductive coupling and capacitive coupling. In some embodiments, first shielding layer 114 includes copper, aluminum, nickel, tungsten, titanium, or another suitable conductive material. In some embodiments, first shielding layer 114 is omitted and LC structure 100 includes only second shielding layer 130. In some embodiments, first shielding layer 114 provides a range of attenuation from −0.1 dB to 2 dB over a range of frequencies from 10 gigahertz (GHz) to 30 GHz.

Capacitor C1 is the effective capacitance between the first shielding layer 114 and the first gate layer 118. In some embodiments, capacitor C1 is referred to as a Metal Oxide Metal Capacitor (MOMCAP). In some embodiments, the value of capacitor C1 is fixed. Capacitor C1 has a capacitance between about 30 femtofarads (fF) and about 3 picofarads (pF).

First gate layer 118 is formed in first IMD layer 104. First gate layer 118 is electrically connected to second gate layer 128 by conductive line 140. First gate layer 118 is a gate electrode where a first input signal to the lower portion of LC structure 100 is applied. First gate layer 118 includes a doped or non-doped polycrystalline silicon (or polysilicon). Alternatively, the first gate layer 118 includes a metal, such as Al, Cu, W, Ti, Ta, TiN, TaN, NiSi, CoSi, other suitable conductive materials, or combinations thereof, in some embodiments. In some embodiments, the first gate layer 118 is formed by chemical vapor deposition (CVD), physical vapor deposition (PVD), atomic layer deposition (ALD), plating, or other processes. In some embodiments, the first gate layer 118 has a multilayer structure and is formed in a multiple-step process. In some embodiments, first gate layer 118 is omitted and LC structure 100 includes only second gate layer 128.

First gate layer 118 has a thickness between about 0.1 μm and about 2 μm. In some embodiments, the thickness of the first gate layer 118 is larger or smaller depending on design requirements for the LC structure 100.

Capacitor C2 is the effective capacitance between the first gate layer 118 and the second substrate 120. In some embodiments, capacitor C2 is referred to as a Metal Oxide Substrate Capacitor (MOSCAP). The value of capacitor C2 is tunable based on a voltage of first input signal applied to the first gate layer 118. In some embodiments, the capacitance value of capacitor C2 is increased as the voltage applied to the first gate layer 118 is increased. In some embodiments, the capacitance value of capacitor C2 is decreased as the voltage applied to the first gate layer 118 is decreased. In some embodiments, the value of capacitor C2 is adjusted to tune the first LC tank circuit 100*a* of LC structure 100. Capacitor C2 has a capacitance between about 30 fF and about 3 pF.

Second substrate 120 is above first IMD layer 104 and first gate layer 118. Second substrate 120 is used to create a 3-Dimensional Integrated Circuit (3-D IC). In some embodiments, second substrate 120 is used to create a symmetric circuit structure positioned above and below the second substrate 120. In some embodiments, second substrate 120 is used to create a stacked, differential LC tank circuit structure which includes a first LC tank circuit structure located above the second substrate 120 and outputs a signal 180 degrees out of phase with an output of a second LC tank circuit structure positioned below the second substrate 120. In some embodiments, second substrate 120 is used to create asymmetric circuit structures positioned above and below the second substrate 120. In some embodiments, second substrate 120 is connected to ground (not shown). In some embodiments, second substrate 120 includes polysilicon, doped silicon, or other suitable conductive materials. In some embodiments, a thickness of second substrate 120 ranges from about 50 nanometers (nm) to about 150 nm. In some embodiments, the thickness of second substrate 120 ranges from about 150 nanometers (nm) to about 450 nm. In some embodiments, the thickness of second substrate 120 ranges from about 450 nanometers (nm) to about 850 nm. If the thickness of second substrate 120 is too great, forming conductive line 140 becomes difficult and the length of the conductive line 140 unnecessarily increases resistance in LC structure 100, in some embodiments.

In some embodiments, a separation between first conductive line 106*a* and second substrate 120 ranges from about 500 nm to about 1 μm. In some embodiments, the separation between first conductive line 106*a* and second substrate 120 ranges from about 1 μm to about 2 μm. In some embodiments, the separation between first conductive line 106*a* and second substrate 120 ranges from about 2 μm to about 5 μm. In some embodiments, the separation between first conductive line 106*a* and second substrate 120 ranges from about 5 μm to about 15 μm. If the separation is too small, first IMD layer 104 is not able to provide sufficient insulation between first conductive line 106*a* and second substrate 120, in some embodiments.

Second IMD layer 126 includes a dielectric material configured to insulate the conductive lines or conductive vias. In some embodiments, second IMD layer 126 is a multi-layer material having conductive lines extending in a plane parallel to a top surface of second substrate 120. In some embodiments, second IMD layer 126 is a multi-layer material having one or more conductive lines positioned in each layer of second IMD layer 126. In some embodiments, second IMD layer 126 is a multi-layer material having conductive vias connecting conductive lines in separate layers of the second IMD layer 126. In some embodiments, second IMD layer 126 includes an interconnect structure configured to electrically connect active devices in second substrate 120. The dielectric material in second IMD layer 126 is used to provide insulation between adjacent conductive lines or conductive vias. In some embodiments, the dielectric material of second IMD layer 126 includes a low-k dielectric material. In some embodiments, the dielectric material of second IMD layer 126 is a same dielectric material as first IMD layer 104. In some embodiments, the dielectric material of second IMD layer 126 is different from the dielectric material of first IMD layer 104. In some embodiments, second IMD layer 126 comprises a plurality of layers. In some embodiments, second IMD layer 126 comprises second IMD layers 126*a*, 126*b*, 126*c*, and 126*d*. In some embodiments, second IMD layer 126 includes a dielectric material including oxide or another suitable insulating material.

In some embodiments, a separation between second conductive line 106*b* and second substrate 120 ranges from about 1 μm to about 2 μm. In some embodiments, the separation between second conductive line 106*b* and second substrate 120 ranges from about 2 μm to about 5 μm. In some embodiments, the separation between second conductive line 106*b* and second substrate 120 ranges from about 5 μm to about 15 μm. If the separation is too small, second IMD layer 126 is not able to provide sufficient insulation between second conductive line 106*b* and second substrate 120, in some embodiments. In some embodiments, the separation between first conductive line 106*a* and second substrate 120 is equal to the separation between second conductive line 106*b* and the second substrate. In some embodiments, the separation between first conductive line 106*a* and second substrate 120 is different from the separation between second conductive line 106*b* and the second substrate.

Second gate layer 128 is in second IMD layer 126. Second gate layer 128 is electrically connected to first gate layer 118 by conductive line 140. Second gate layer 128 is a gate electrode where a second input signal to the upper portion of LC structure 100 is applied. Second gate layer 128 includes a doped or non-doped polycrystalline silicon (or polysilicon). Alternatively, the second gate layer 128 includes a metal, such as Al, Cu, W, Ti, Ta, TiN, TaN, NiSi, CoSi, other suitable conductive materials, or combinations thereof, in some embodiments. In some embodiments, the second gate layer 128 is formed by CVD, PVD, ALD, plating, or other processes. In some embodiments, the second gate layer 128 has a multilayer structure and is formed in a multiple-step process. In some embodiments, second gate layer 128 is omitted and LC structure 100 includes only first gate layer 118.

Second gate layer 128 has a thickness between about 0.1 μm and about 2 μm. In some embodiments, the thickness of the second gate layer 128 is larger or smaller depending on design requirements for the LC structure 100.

Capacitor C3 is the effective capacitance between the second gate layer 128 and the second substrate 120. In some embodiments, capacitor C3 is referred to as a MOSCAP. The value of capacitor C3 is tunable based on a voltage of second input signal applied to the second gate layer 128. In some embodiments, the capacitance value of capacitor C3 is increased as the voltage applied to the second gate layer 128 is increased. In some embodiments, the capacitance value of capacitor C3 is decreased as the voltage applied to the second gate layer 128 is decreased. In some embodiments, the value of capacitor C3 is adjusted to tune the second LC tank circuit 300*b* of LC structure 100. Capacitor C3 has a capacitance between about 30 fF and about 3 pF.

Second shielding layer 130 includes a conductive material to isolate first conductive line 106*a* and second conductive line 106*b*. Second shielding layer 130 reduces the mutual inductive coupling and capacitive coupling between first conductive line 106*a* and second conductive line 106*b*. In some embodiments, second shielding layer 130 is in a two-dimensional plane in second IMD layer 126. In some embodiments, second shielding layer 130 is a three-dimensional structure in second IMD layer 126. In some embodiments, the orientation of the second shielding layer 130 is parallel to the first conductive line 106*a* and second conductive line 106*b*. In some embodiments, the second shielding layer 130 includes a conductive plate coupled to ground. In some embodiments, the second shielding layer 130 is a solid conductor with a plate-like shape. In some embodiments, the second shielding layer 130 includes a solid conductor with hole-like portions, formed therein, shaped in various patterns, such as rectangular, square, circular, hexagonal, or other geometric shapes.

Second shielding layer 130 is electrically isolated from the conductive line 140 by the second recess portion 132. Second recess portion 132 has a width between about 0.1 μm and about 5 μm. Second shielding layer 130 has a thickness between about 0.1 μm and about 4 μm. In some embodiments, the thickness of the second shielding layer 130 is larger or smaller depending on design requirements for the LC structure 100. A larger thickness will provide greater protection from mutual inductive coupling and capacitive coupling. A smaller thickness will reduce the protection from mutual inductive coupling and capacitive coupling. One of ordinary skill in the art will recognize the ability to select a desired thickness attuned to the design requirements of the LC structure 100. In some embodiments, second shielding layer 130 includes copper, aluminum, nickel, tungsten, titanium, or another suitable conductive material. In some embodiments, second shielding layer 130 is omitted and LC structure 100 includes only first shielding layer 114. In some embodiments, second shielding layer 134 provides a range of attenuation from 0.1 dB to 2 dB over a range of frequencies from 10 GHz to 30 GHz.

Capacitor C4 is the effective capacitance between the second gate layer 128 and the second shielding layer 130. In some embodiments, capacitor C4 is referred to as a MOM-CAP. In some embodiments, the value of capacitor C4 is fixed. Capacitor C4 has a capacitance between about 30 fF and about 3 pF.

Second conductive line 106*b* includes conductive lines in second IMD layer 126. In some embodiments, second conductive line 106*b* is a conductive winding structure in a two-dimensional plane in second IMD layer 126. In some embodiments, second conductive line 106*b* is positioned in a two-dimensional plane which is parallel to second shielding layer 130. In some embodiments, second conductive line 106*b* is a three-dimensional conductive winding structure in second IMD layer 126. In some embodiments, second conductive line 106*b* includes a single port for either receiving or outputting an electrical current. Second conductive line 106*b* includes a first straight conductive line 138*a* and a second straight conductive line 138*b* on a same level of second IMD layer 126. Second conductive line 106*b* further includes a third straight conductive line 134 on a different level of second IMD layer 126. Second conductive line 106*b* further includes a first conductive via 136*a* connecting first straight conductive line 138*a* to third straight conductive line 134; and a second conductive via 136*b* connecting second straight conductive line 138*b* to third straight conductive line 134. In some embodiments, first straight conductive line 138*a* and second straight conductive line 138*b* are on a level of second IMD layer 126 above third straight conductive line 134. In some embodiments, first straight conductive line 138*a* and second straight conductive line 138*b* are on a level of second IMD layer 126 below third straight conductive line 134. In some embodiments, second conductive line 106*b* includes more than one port and is capable of both receiving and outputting an electrical current. In some embodiments, second conductive line 106*b* includes copper, aluminum, nickel, tungsten, titanium, or another suitable conductive material. In some embodiments, second conductive line 106*b* is omitted and LC structure 100 includes first conductive line 106*a*. In some embodiments, a shape of second conductive line 106*b* is a same shape as first conductive line 106*a*. In some embodiments, the shape of second conductive line 106*b* is different from first conductive line 106*a*. In some embodiments, a thickness of second conductive line 106*b* ranges from about 0.1 μm to about 4 μm. In some embodiments, a depth of second straight conductive line 138*a* ranges from about 0.5 μm to about 4 μm. In some embodiments, second conductive line 106*b* includes one or more inductors with a range of inductances from about 0.5 nH to about 10 nH.

In some embodiments, second conductive line 106*b* is a meandering type conductive winding in which a conductive line extends along an angled direction with respect to an x-axis and a y-axis of second IMD layer 126. Conductive lines in a same layer of second IMD layer 126 extend parallel to one another. Conductive lines in a different layer of second IMD layer 126 are arranged to allow electrical connection between the parallel conductive lines; and conductive vias connect the conductive lines on the different layers of the second IMD layer 126.

In some embodiments, second conductive line 106*b* is a spiral type conductive winding in which conductive lines are arranged in a spiral arrangement in different layers of second IMD layer 126. Conductive vias provide electrical connections between the conductive lines in the different layers of second IMD layer 126.

Conductive line 140 is used to electrically connect first conductive line 106*a* to second conductive line 106*b*. Conductive line 140 extends through second substrate 120. In some embodiments, conductive line 140 is a metal line, a via, a through silicon via (TSV), an inter-level via (ILV), or another suitable conductive line. In some embodiments, conductive line 140 includes copper, aluminum, nickel, titanium, tungsten or another suitable conductive material. In some embodiments, conductive line 140 is a same material as first conductive line 106*a* and second conductive line 106*b*. In some embodiments, conductive line 140 is a different material from first conductive line 106*a* or second conductive material 106*b*. In some embodiments, conductive line 140 is omitted to prevent direct electrical connection between first conductive line 106*a* and second conductive line 106*b*. Conductive line 140 is used to electrically connect first gate layer 118 and second gate layer 128. In some embodiments, conductive line 140 includes one or more conductive line portions.

Switch 122 is formed in second substrate 120 to selectively connect different portions of first conductive line 106*a* and second conductive line 106*b*. In some embodiments, switch 122 includes a plurality of transistors, such as metal-oxide-semiconductor (MOS) transistors, bi-polar junction transistors (BJTs), high electron mobility transistors (HEMTs), or other suitable switching elements. By independently activating switch 122, an inductance and Q factor of LC structure 100 is adjustable. In some embodiments, switch 122 is activated based on control signals received from a controller. In some embodiments, the control signals are generated in response to a user input. In some embodiments, the control signals are generated automatically in response to a detected current change. In some embodiments, in which switch 122 includes transistors, the control signal is applied to a gate of the switch 122 to selectively activate the switch 122. In some embodiments, switch 122 allows LC structure 100 to operate in a dual frequency band design. In some embodiments, switch 122 allows LC structure 100 to operate at 2.4 GHz and 5.8 GHz.

Figure 1B:
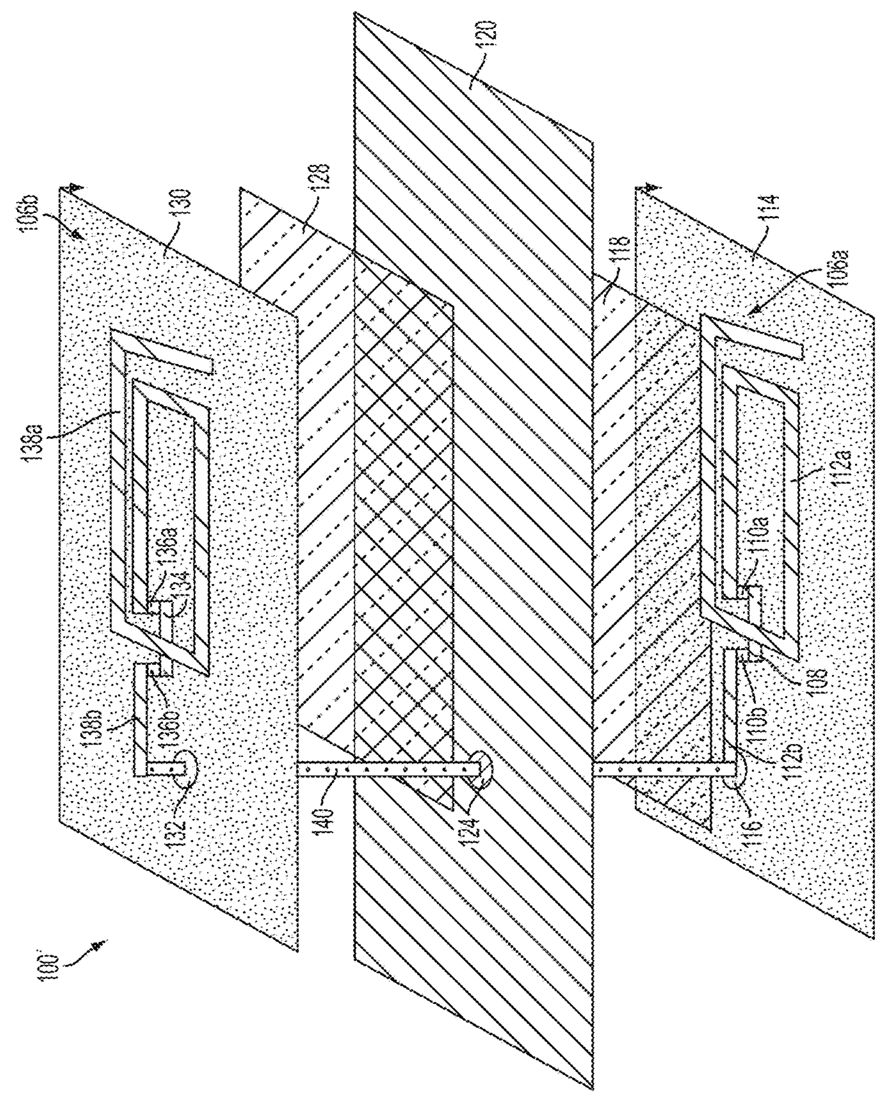
FIG. 1B is a perspective view of an LC structure in accordance with one or more embodiments.

FIG. 1B is a perspective view of an LC structure 100' in accordance with one or more embodiments. LC structure 100' is an embodiment of LC structure 100 with similar elements. As shown in FIG. 1B, similar elements have a same reference number as shown in FIG. 1A. LC structure 100' is an embodiment of LC structure 100 without substrate 102, first IMD layer 104 and second IMD layer 126 (for illustrative purposes).

Figure 2A:
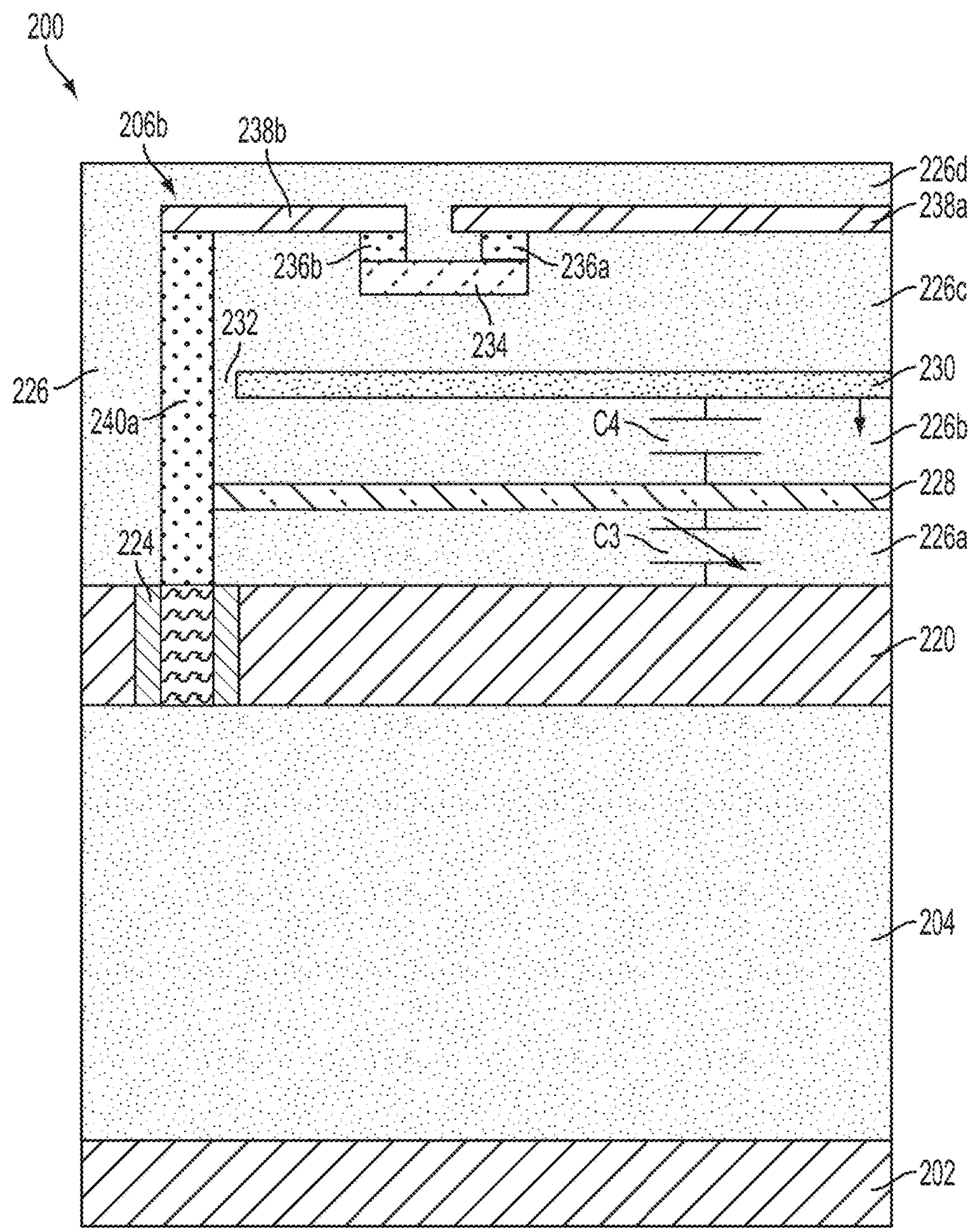
FIG. 2A is a cross sectional view of an LC structure in accordance with one or more embodiments.

FIG. 2A is a cross sectional view of an LC structure 200 in accordance with one or more embodiments. LC structure 200 is an embodiment of LC structure 100 (shown in FIG. 1A) with similar elements. As shown in FIG. 2A, similar elements have a same reference number as shown in FIG. 1A increased by 100. LC structure 200 includes second conductive line 206*b*, second shielding layer 230 and second gate layer 228 in second IMD layer 226. LC structure 200 includes conductive line 240*a*. Conductive line 240*a* is an embodiment of conductive line 140 shown in FIG. 1A. Conductive line 240*a* is used to electrically connect second conductive line 206*b* to second gate layer 228. In some embodiments, conductive line 240*a* extends into substrate 220 providing additional capacitance to LC structure 200.

Figure 2B:
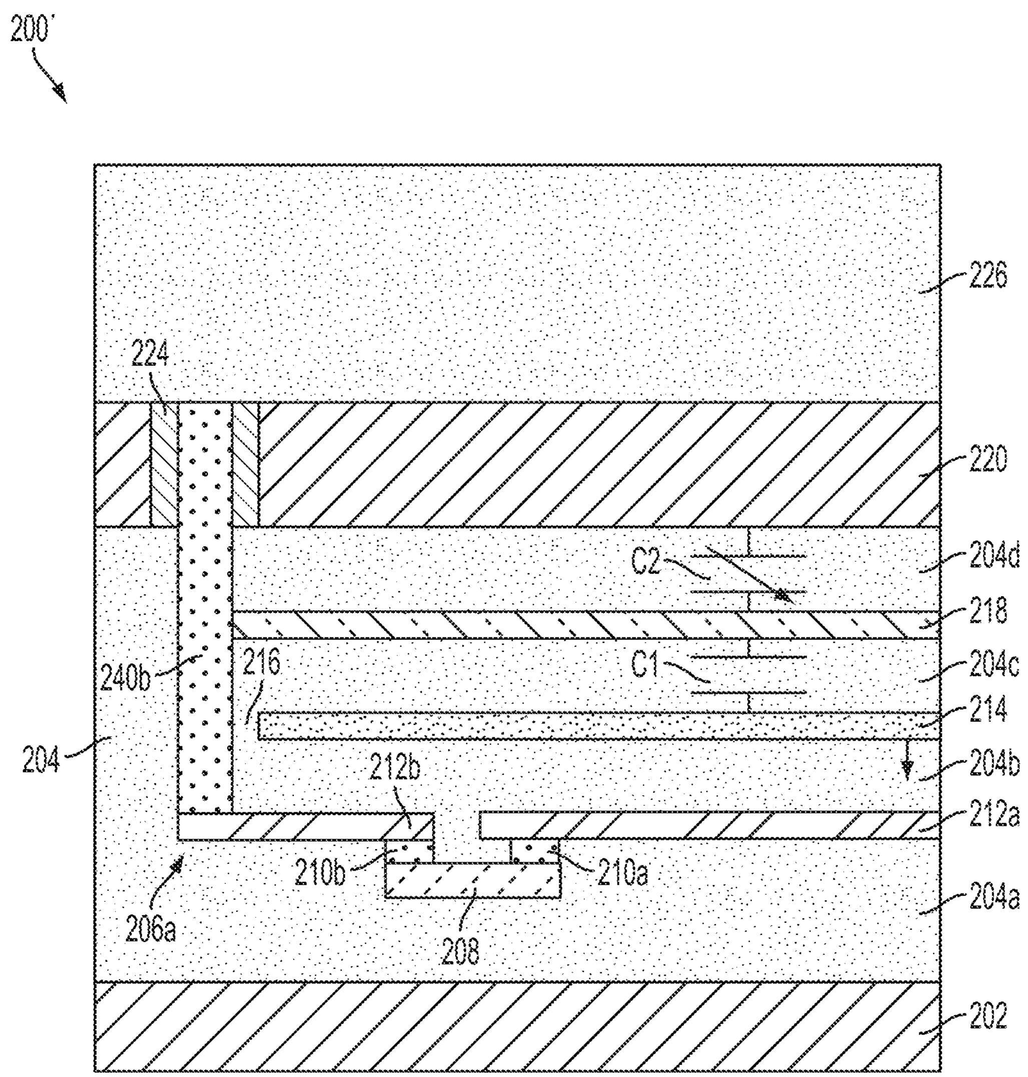
FIG. 2B is a cross sectional view of an LC structure in accordance with one or more embodiments.

FIG. 2B is a cross sectional view of an LC structure 200' in accordance with one or more embodiments. LC structure 200' is an embodiment of LC structure 100 (shown in FIG. 1A) with similar elements. As shown in FIG. 2B, similar elements have a same reference number as shown in FIG. 1A increased by 100. In comparison with LC structure 200 (shown in FIG. 2A), LC structure 200' does not include a second conductive line 206*b*, second shielding layer 230 and second gate layer 228 in a second IMD layer 226. LC structure 200' includes first conductive line 206*a*, first shielding layer 214 and first gate layer 218 in first IMD layer 204. LC structure 200' includes conductive line 240*b*. Conductive line 240*b* is an embodiment of conductive line 140 shown in FIG. 1A. Conductive line 240*b* is used to electrically connect first conductive line 206*a* to first gate layer 218. In some embodiments, conductive line 240*b* extends into substrate 220 providing additional capacitance to LC structure 200'.

Figure 3A:
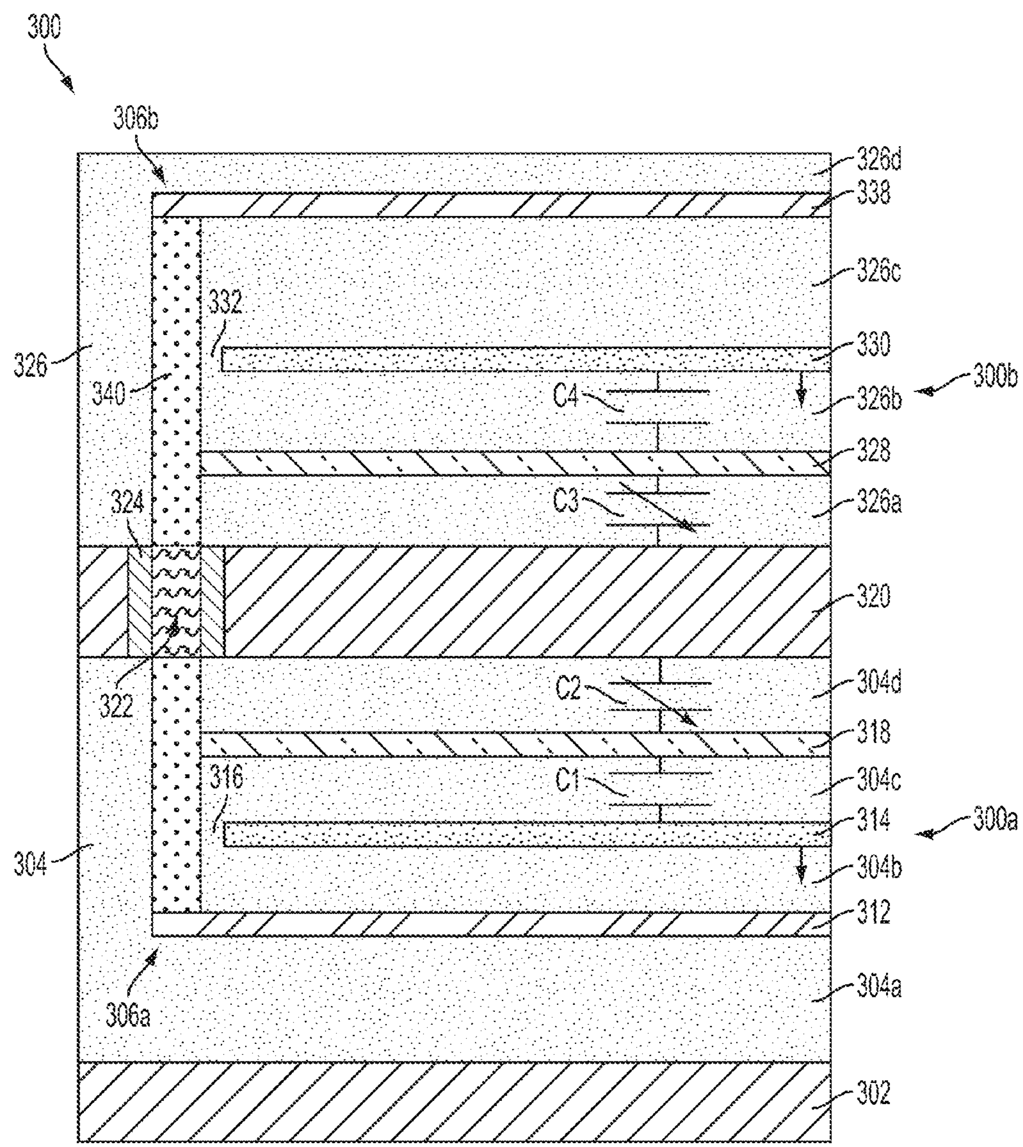
FIG. 3A is a cross sectional view of an LC transmission line structure in accordance with one or more embodiments.

FIG. 3A is a cross sectional view of an LC transmission line structure 300 in accordance with one or more embodiments. LC transmission line structure 300 is an embodiment of LC structure 100 (shown in FIG. 1A) with similar elements. As shown in FIG. 3, similar elements have a same reference number as shown in FIG. 1A increased by 200. LC transmission line structure 300 includes first conductive line 306*a* and second conductive line 306*b*. In comparison with LC structure 100 (shown in FIG. 1A), first conductive line 306*a* does not include first straight conductive line 112*a*, second straight conductive line 112*b*, third straight conductive line 108, first conductive via 110*a*, and second conductive via 110*b*. In comparison with LC structure 100 (shown in FIG. 1A), second conductive line 306*b* does not include first straight conductive line 138*a*, second straight conductive line 138*b*, third straight conductive line 134, first conductive via 136*a*, and second conductive via 136*b*. In some embodiments, LC transmission line structure 300 is in a stacked configuration with a first LC transmission line structure 300*a* located below the second substrate 320, and a second LC transmission line structure 300*b* located above the second substrate 320. In some embodiments, first LC transmission line structure 300*a* and second LC transmission line structure 300*b* operate in a differential mode.

First conductive line 306*a* includes lower conductive line 312 in first IMD layer 304. In some embodiments, first conductive line 306*a* includes one or more lower conductive lines in first IMD layer 304. In some embodiments, lower conductive line 312 is a transmission line structure. In some embodiments, lower conductive line 312 is a conductive structure in a two-dimensional plane in first IMD layer 304. In some embodiments, lower conductive line 312 is a three-dimensional conductive structure in first IMD layer 304. In some embodiments, lower conductive line 312 is parallel to first shielding layer 314. In some embodiments, lower conductive line 312 includes a single port for either receiving or outputting an electrical current. In some embodiments, lower conductive line 312 includes more than one port and is capable of both receiving and outputting an electrical current. In some embodiments, lower conductive line 312 is capable of both receiving and outputting an electrical signal with a frequency range of about 10 GHz to about 30 GHz. In some embodiments, lower conductive line 312 includes copper, aluminum, nickel, tungsten, titanium, or another suitable conductive material. In some embodiments, lower conductive line 312 is omitted and LC transmission line structure 300 includes upper conductive line 338. In some embodiments, a shape of lower conductive line 312 is a same shape as upper conductive line 338. In some embodiments, the shape of lower conductive line 312 is different from upper conductive line 338. In some embodiments, a thickness of lower conductive line 312 ranges from about 0.1 μm to about 4 μm. In some embodiments, a depth of lower conductive line 312 ranges from about 0.1 μm to about 4 μm.

Second conductive line 306*b* includes upper conductive line 338 in second IMD layer 326. In some embodiments, second conductive line 306*b* includes one or more upper conductive lines in second IMD layer 326. In some embodiments, upper conductive line 338 is a transmission line structure. In some embodiments, upper conductive line 338 is a conductive structure in a two-dimensional plane in second IMD layer 326. In some embodiments, upper conductive line 338 is a three-dimensional conductive structure in second IMD layer 326. In some embodiments, upper conductive line 338 is parallel to second shielding layer 330. In some embodiments, upper conductive line 338 includes a single port for either receiving or outputting an electrical current. In some embodiments, upper conductive line 338 includes more than one port and is capable of both receiving and outputting an electrical current. In some embodiments, upper conductive line 338 is capable of both receiving and outputting an electrical signal with a frequency range of about 10 gigahertz (GHz) to about 30 GHz. In some embodiments, upper conductive line 338 includes copper, aluminum, nickel, tungsten, titanium, or another suitable conductive material. In some embodiments, upper conductive line 338 is omitted and LC transmission line structure 300 includes only lower conductive line 312. In some embodiments, a shape of upper conductive line 338 is a same shape as lower conductive line 312. In some embodiments, the shape of upper conductive line 338 is different from lower conductive line 312. In some embodiments, a thickness of upper conductive line 338 ranges from about 0.1 μm to about 4 μm. In some embodiments, a depth of upper conductive line 338 ranges from about 0.1 μm to about 4 μm.

In some embodiments, first conductive line 306*a* and second conductive 306*b* are meandering type conductive line(s) in which a conductive line extends along an angled direction with respect to an x-axis and a y-axis of second IMD layer 326. In some embodiments, conductive lines in a same layer of second IMD layer 326 extend parallel to one another. In some embodiments, conductive lines in a same layer of second IMD layer 326 extend perpendicular to one another.

In some embodiments, a separation between first conductive line 306*a* and second substrate 320 ranges from about 0.2 μm to about 2 μm. In some embodiments, a separation between second conductive line 306*b* and second substrate 320 ranges from about 0.2 μm to about 2 μm. In some embodiments, the separation between second conductive line 306*b* and second substrate 320 is equal to the separation between first conductive line 306*a* and the second substrate 320. In some embodiments, the separation between second conductive line 306*b* and second substrate 320 is different from the separation between first conductive line 306*a* and the second substrate 320.

Figure 3B:
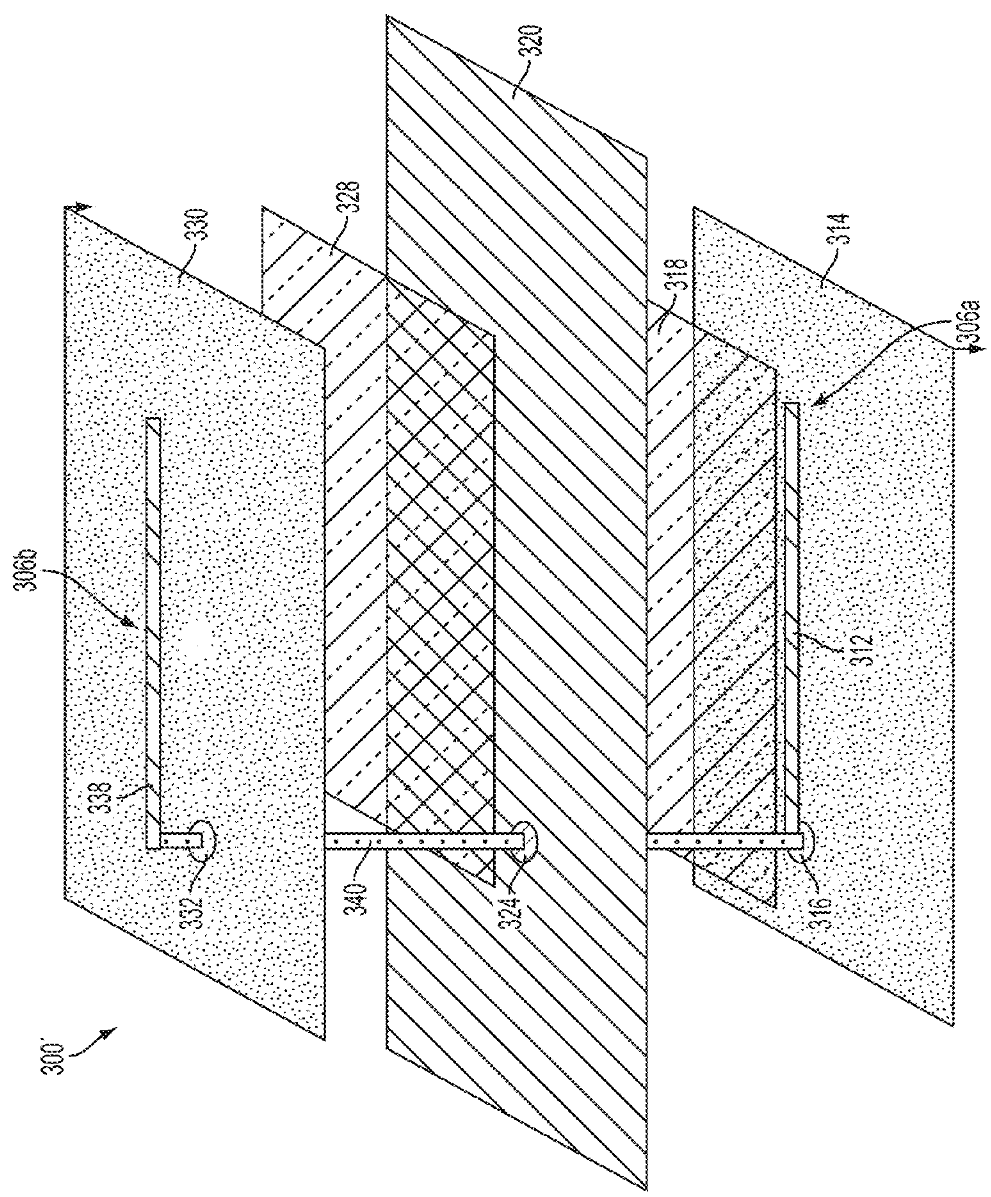
FIG. 3B is a perspective view of an LC transmission line structure in accordance with one or more embodiments.

FIG. 3B is a perspective view of an LC transmission line structure 300' in accordance with one or more embodiments. LC transmission line structure 300' is an embodiment of LC structure 300 with similar elements. As shown in FIG. 3B, similar elements have a same reference number as shown in FIG. 3A. LC transmission line structure 300' is an embodiment of LC transmission line structure 300 without substrate 302, first IMD layer 304 and second IMD layer 326 (for illustrative purposes).

Figure 4A:
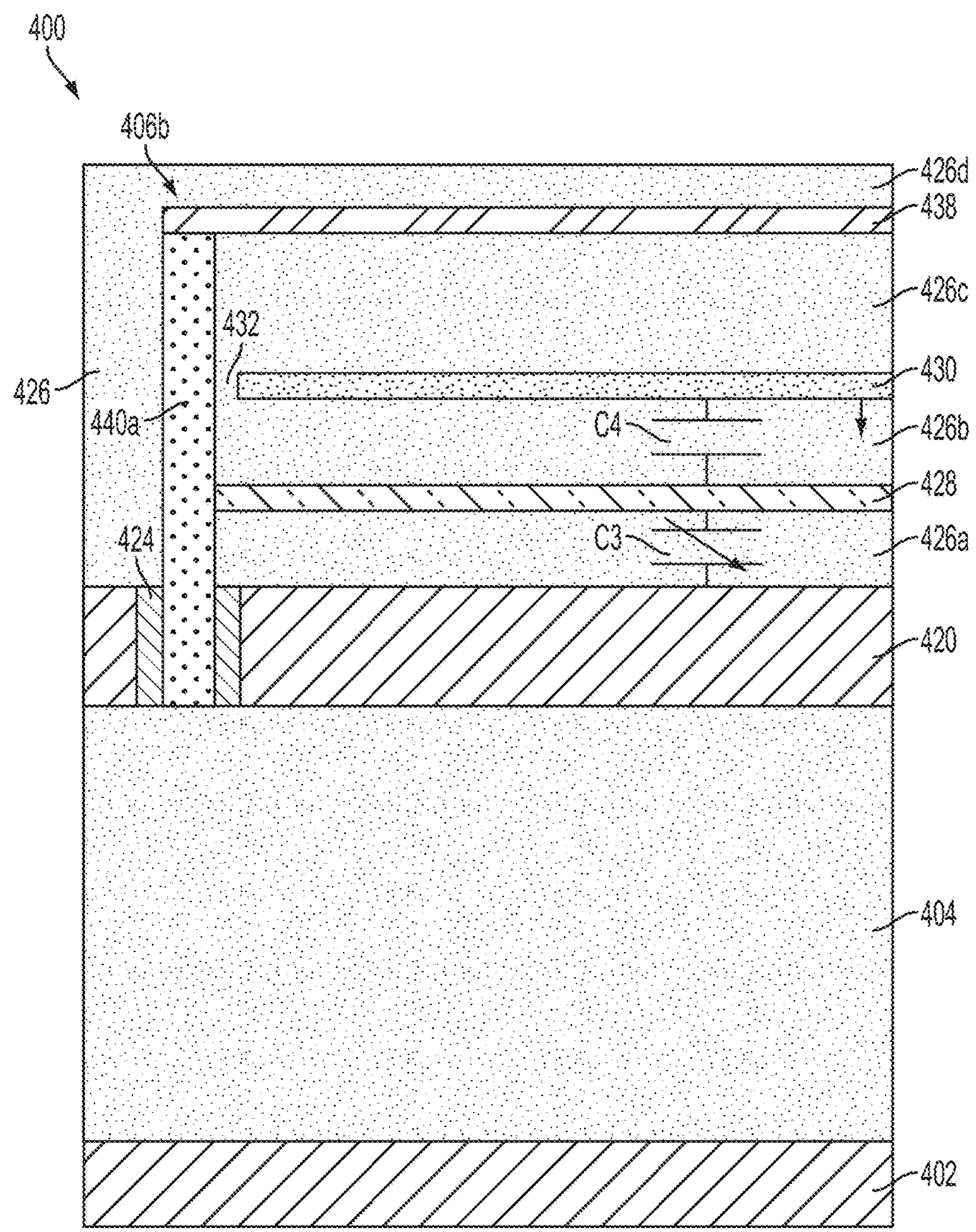
FIG. 4A is a cross sectional view of an LC transmission line structure in accordance with one or more embodiments.

FIG. 4A is a cross sectional view of an LC transmission line structure 400 in accordance with one or more embodiments. LC transmission line structure 400 is an embodiment of LC transmission line structure 300 (shown in FIG. 3A) with similar elements. As shown in FIG. 4A, similar elements have a same reference number as shown in FIG. 3A increased by 100. LC transmission line structure 400 includes second conductive line 406*b*, upper conductive line 438, second shielding layer 430 and second gate layer 428 in second IMD layer 426. LC transmission line structure 400 includes conductive line 440*a*. Conductive line 440*a* is an embodiment of conductive line 340 shown in FIGS. 3A & 3B. Conductive line 440*a* is used to electrically connect second conductive line 406*b* to second gate layer 428. In some embodiments, conductive line 440*a* extends into substrate 420 providing additional capacitance to LC structure 400.

Figure 4B:
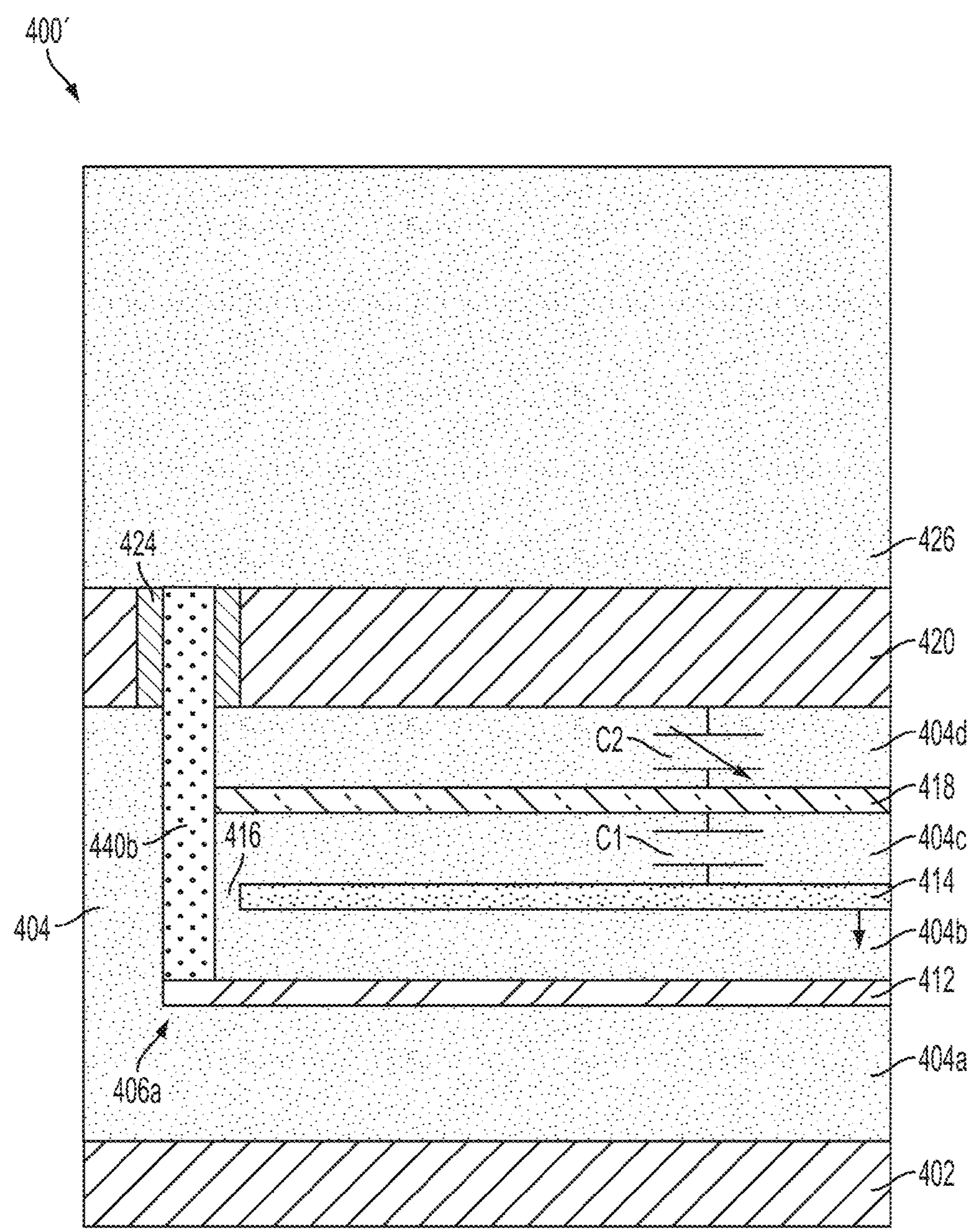
FIG. 4B is a cross sectional view of an LC transmission line structure in accordance with one or more embodiments.

FIG. 4B is a cross sectional view of an LC transmission line structure 400' in accordance with one or more embodiments. LC transmission line structure 400' is an embodiment of LC transmission line structure 300 (shown in FIG. 3A) with similar elements. As shown in FIG. 4B, similar elements have a same reference number as shown in FIG. 3A increased by 100. In comparison with LC transmission line structure 400 (shown in FIG. 4A), LC structure 400' does not include a second conductive line 406*b*, upper conductive line 438, second shielding layer 430 and second gate layer 428 in a second IMD layer 426. LC transmission line structure 400' includes first conductive line 406*a*, lower conductive line 412, first shielding layer 414 and first gate layer 418 in first IMD layer 404. LC structure 400' includes conductive line 440*b*. Conductive line 440*b* is an embodiment of conductive line 340 shown in FIG. 3. Conductive line 440*b* is used to electrically connect first conductive line 406*a* to first gate layer 418. In some embodiments, conductive line 440*b* extends into substrate 420 providing additional capacitance to LC structure 400'.

Figure 5:
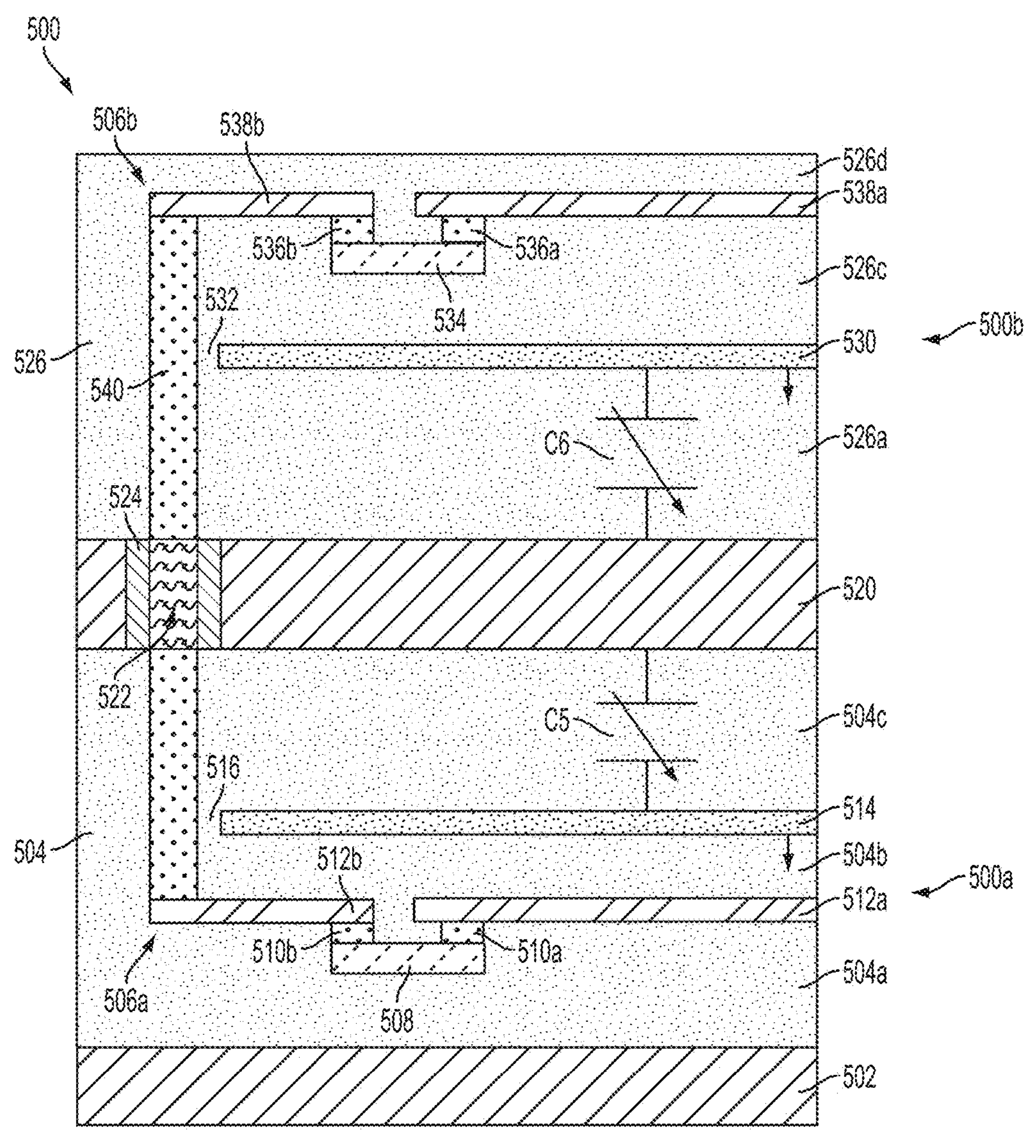
FIG. 5 is a cross sectional view of an LC structure in accordance with one or more embodiments.

FIG. 5 is a cross sectional view of an LC structure 500 in accordance with one or more embodiments. LC structure 500 is an embodiment of LC structure 100 (shown in FIG. 1A) with similar elements. As shown in FIG. 5, similar elements have a same reference number as shown in FIG. 1A increased by 400. In comparison with LC structure 100 (shown in FIG. 1A), LC structure 500 does not include first gate layer 118 and second gate layer 128.

In some embodiments, LC structure 500 is in a stacked configuration with a first LC tank circuit structure 500*a* located below the second substrate 520, and a second LC tank circuit structure 500*b* located above the second substrate 520. In some embodiments, first LC tank circuit structure 500*a* and second LC tank circuit structure 500*b* operate in a differential mode.

LC structure 500 includes a first shielding layer 514 over the first conductive line 506*a*. LC structure 500 includes a first IMD layer 504*c* over the first shielding layer 514. LC structure 500 includes a second substrate 520 over first IMD layer 504*c*. LC structure 500 includes a second IMD layer 526*a* over the second substrate 520 and a second shielding layer 530 in second IMD layer 526*a*. LC structure 500 includes a second IMD layer 526*c* over the second shielding layer 530 and a second conductive line 506*b* in second IMD layer 526*c*. The second conductive line 506*b* is over the second shielding layer 530. LC structure 500 includes a second IMD layer 526*d* over the second conductive line 506*b*. In some embodiments, the second IMD layer 526*d* is omitted.

Capacitor C5 is the effective capacitance between the first shielding layer 514 and the second substrate 520. In some embodiments, capacitor C5 is referred to as a MOSCAP. The value of capacitor C5 is tunable based on a voltage of first input signal applied to the first conductive line 506*a*. In some embodiments, the capacitance value of capacitor C5 is increased as the voltage applied to the first conductive line 506*a* is increased. In some embodiments, the capacitance value of capacitor C5 is decreased as the voltage applied to the first conductive line 506*a* is decreased. In some embodiments, the value of capacitor C5 is adjusted to tune the first LC tank circuit 500*a* of LC structure 500. Capacitor C5 has a capacitance between about 30 fF and about 3 pF.

Capacitor C6 is the effective capacitance between the second shielding layer 530 and the second substrate 520. In some embodiments, capacitor C6 is referred to as a MOSCAP. The value of capacitor C6 is tunable based on a voltage of a second input signal applied to the second conductive line 506*b*. In some embodiments, the capacitance value of capacitor C6 is increased as the voltage applied to the second conductive line 506*b* is increased. In some embodiments, the capacitance value of capacitor C6 is decreased as the voltage applied to the second conductive line 506*b* is decreased. In some embodiments, the value of capacitor C6 is adjusted to tune the second LC tank circuit 500*b* of LC structure 500. Capacitor C6 has a capacitance between about 30 fF and about 3 pF.

Figure 6A:
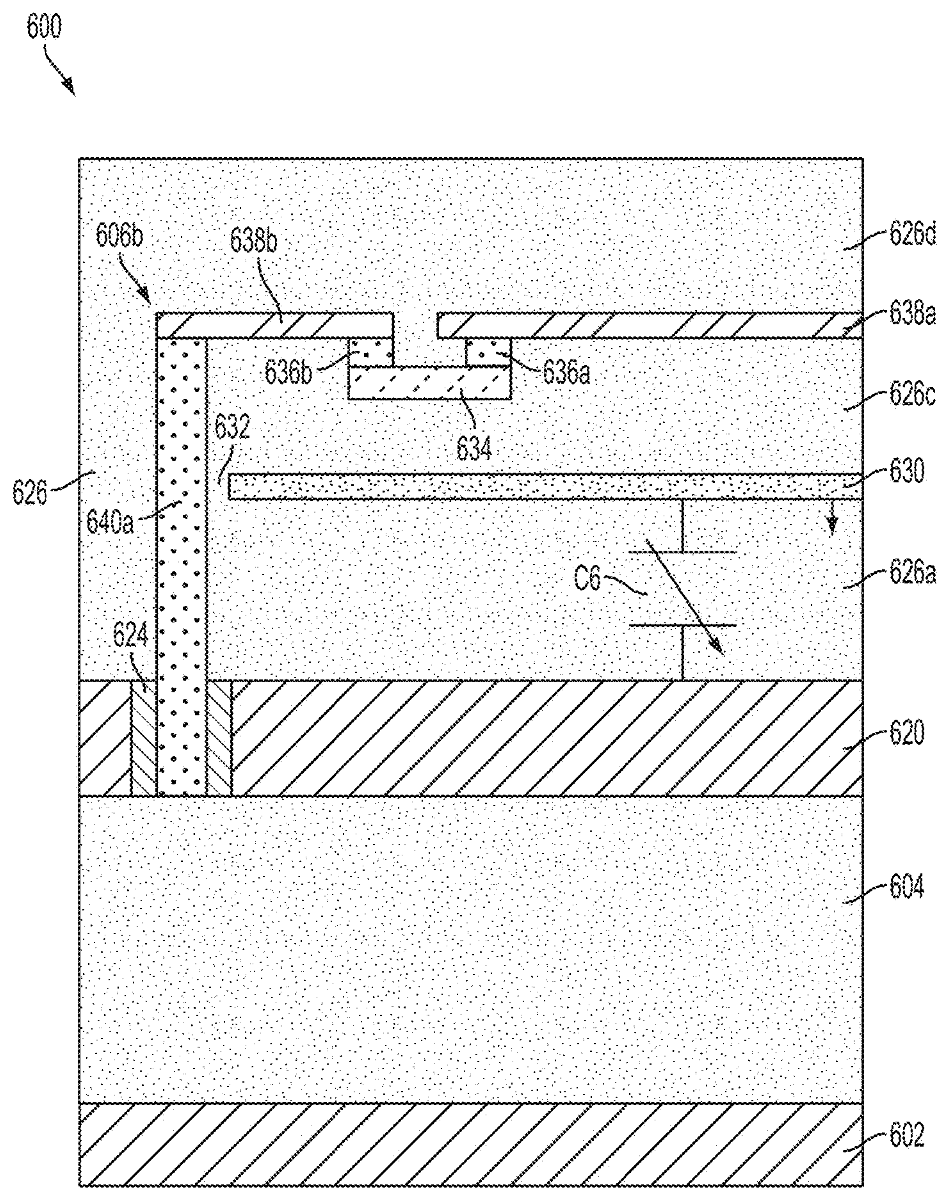
FIG. 6A is a cross sectional view of an LC structure in accordance with one or more embodiments.

FIG. 6A is a cross sectional view of an LC structure 600 in accordance with one or more embodiments. LC structure 600 is an embodiment of LC structure 500 (shown in FIG. 5) with similar elements. As shown in FIG. 6A, similar elements have a same reference number as shown in FIG. 5 increased by 100. LC structure 600 includes second conductive line 606*b* and second shielding layer 630 in second IMD layer 626. LC structure 600 includes conductive line 640*a*. Conductive line 640*a* is an embodiment of conductive line 540 shown in FIG. 5. In some embodiments, insulator 624 is used to electrically isolate conductive line 640*a* from substrate 620. In some embodiments, substrate 620 is connected to ground.

Figure 6B:
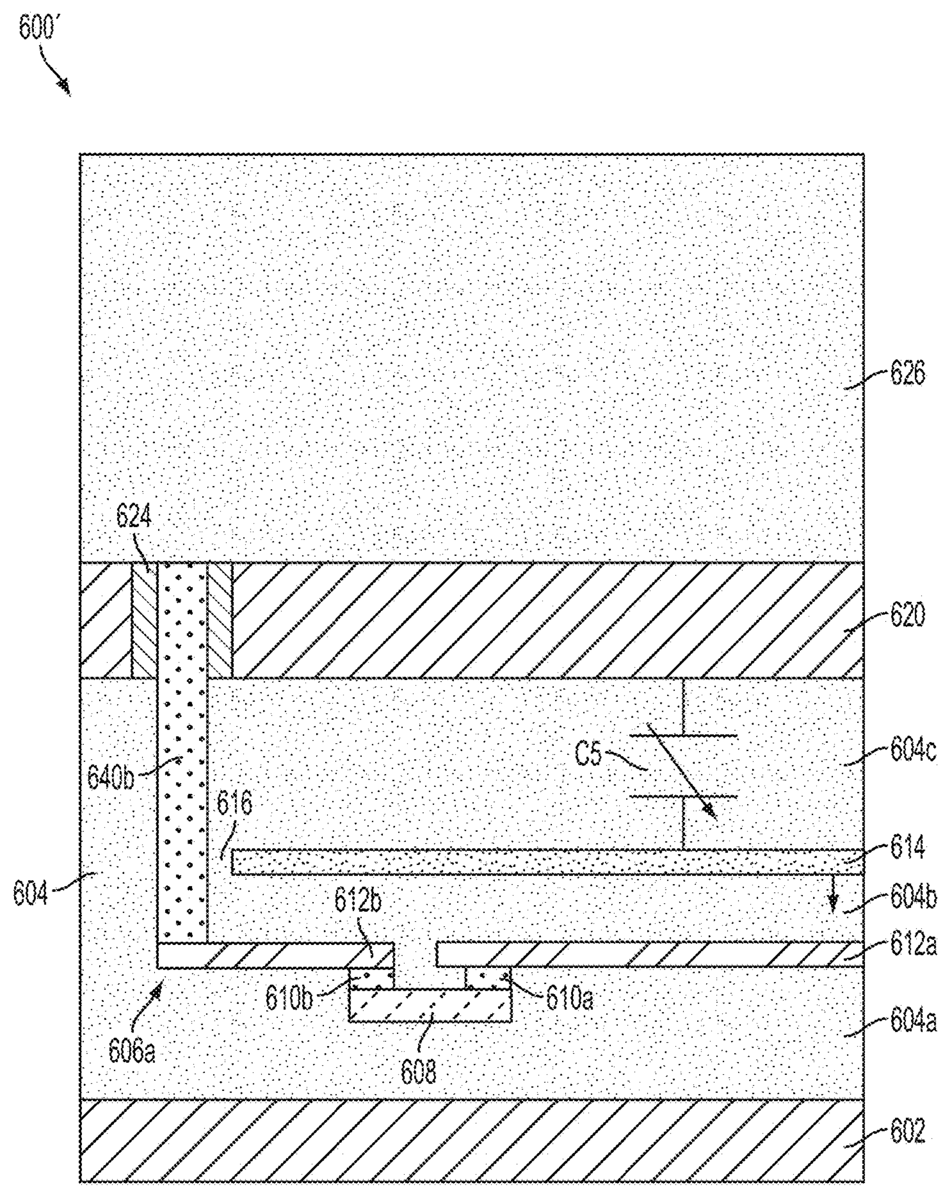
FIG. 6B is a cross sectional view of an LC structure in accordance with one or more embodiments.

FIG. 6B is a cross sectional view of an LC structure 600' in accordance with one or more embodiments. LC structure 600' is an embodiment of LC structure 500 (shown in FIG. 5) with similar elements. As shown in FIG. 6B, similar elements have a same reference number as shown in FIG. 5 increased by 100. In comparison with LC structure 500 (shown in FIG. 5), LC structure 600' does not include a second conductive line 606*b* and second shielding layer 630 in second IMD layer 626. LC structure 600' includes first conductive line 606*a* and first shielding layer 614 in first IMD layer 604. LC structure 600' includes conductive line 640*b*. Conductive line 640*b* is an embodiment of conductive line 540 shown in FIG. 5. In some embodiments, insulator 624 is used to electrically isolate conductive line 640*b* from substrate 620. In some embodiments, substrate 620 is connected to ground.

Figure 7:
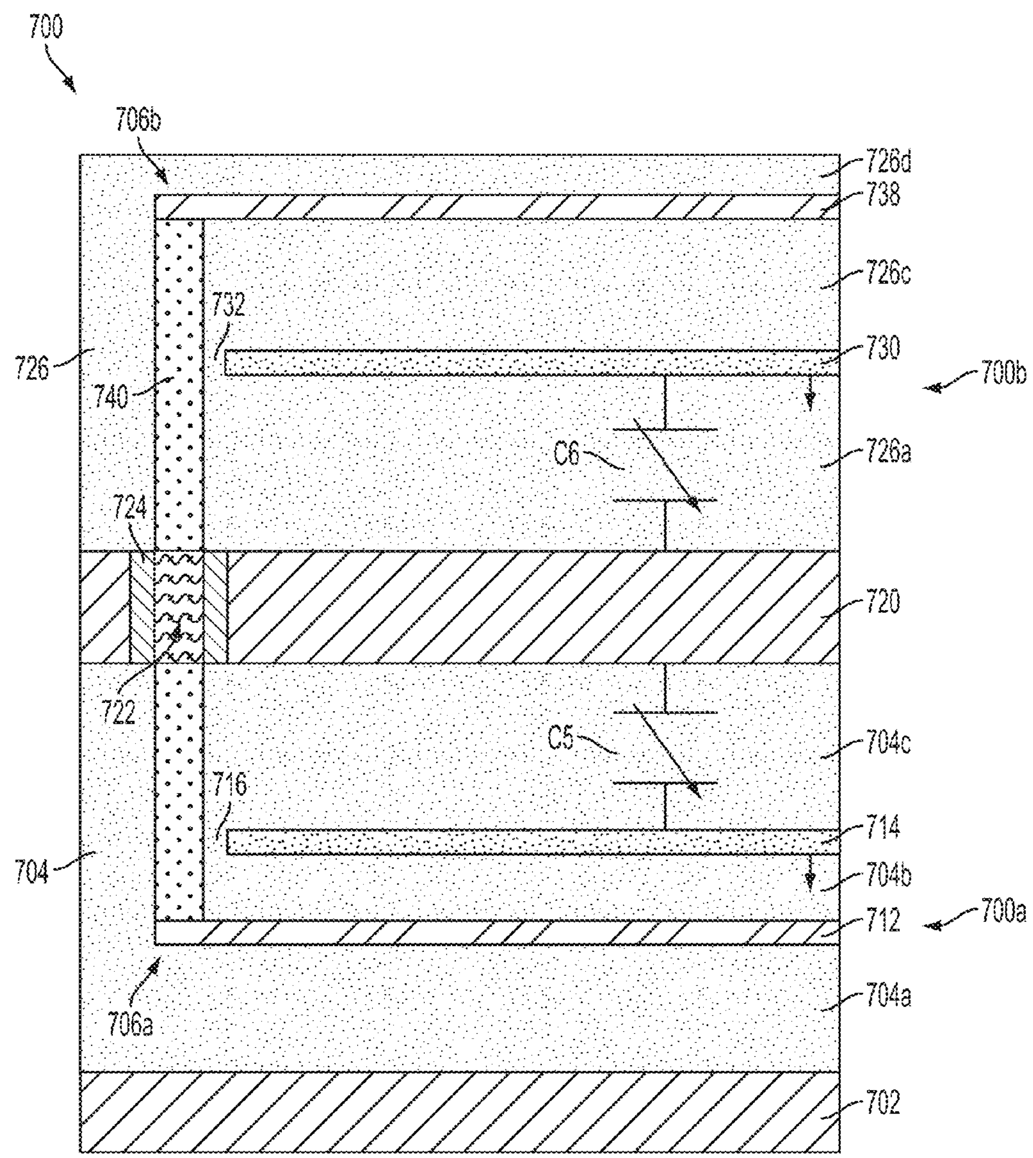
FIG. 7 is a cross sectional view of an LC transmission line structure in accordance with one or more embodiments.

FIG. 7 is a cross sectional view of an LC transmission line structure 700 in accordance with one or more embodiments. LC transmission line structure 700 is an embodiment of LC structure 500 (shown in FIG. 5) with similar elements. As shown in FIG. 7, similar elements have a same reference number as shown in FIG. 5 increased by 200. LC transmission line structure 700 includes first conductive line 706*a* and second conductive line 706*b*. In comparison with LC structure 500 (shown in FIG. 5), first conductive line 706*a* does not include first straight conductive line 512*a*, second straight conductive line 512*b*, third straight conductive line 508, first conductive via 510*a*, and second conductive via 510*b*. In comparison with LC structure 500 (shown in FIG. 5), second conductive line 706*b* does not include first straight conductive line 538*a*, second straight conductive line 538*b*, third straight conductive line 534, first conductive via 536*a*, and second conductive via 536*b*. In some embodiments, LC transmission line structure 700 is in a stacked configuration with a first LC transmission line structure 700*a* located below the second substrate 720, and a second LC transmission line structure 700*b* located above the second substrate 720. In some embodiments, first LC transmission line structure 700*a* and second LC transmission line structure 700*b* operate in a differential mode.

First conductive line 706*a* includes lower conductive line 712 in first IMD layer 704. First conductive line 706*a* is an embodiment of first conductive line 306*a* shown in FIG. 3A. Lower conductive line 712 is an embodiment of lower conductive line 312 shown in FIG. 3A. Second conductive line 706*b* includes upper conductive line 738 in second IMD layer 726. Second conductive line 706*b* is an embodiment of second conductive line 306*b* shown in FIG. 3B. Upper conductive line 738 is an embodiment of upper conductive line 338 shown in FIG. 3B.

Figure 8A:
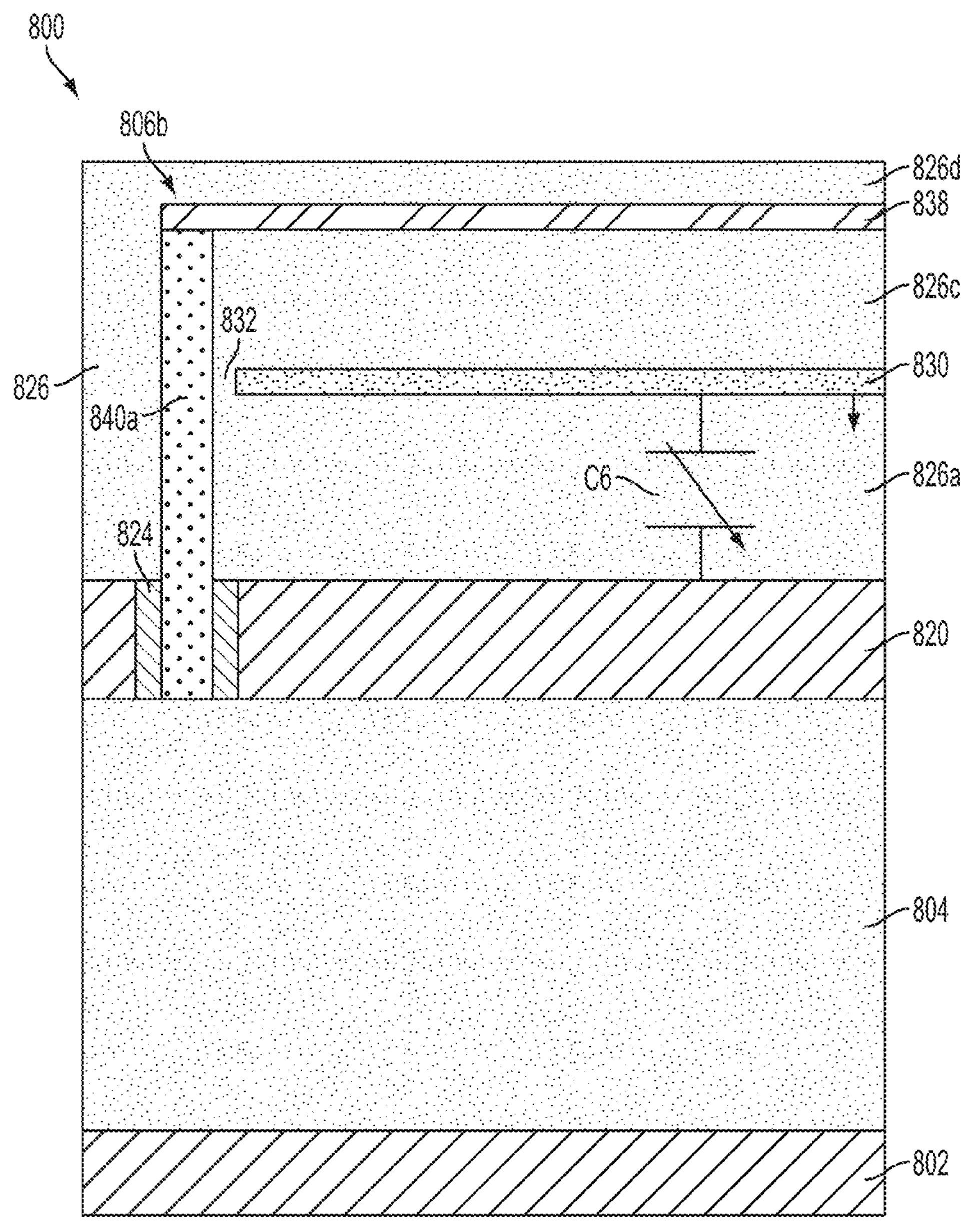
FIG. 8A is a cross sectional view of an LC transmission line structure in accordance with one or more embodiments.

FIG. 8A is a cross sectional view of an LC structure 800 in accordance with one or more embodiments. LC structure 800 is an embodiment of LC structure 600 (shown in FIG. 6) with similar elements. As shown in FIG. 8A, similar elements have a same reference number as shown in FIG. 7 increased by 100. LC structure 800 includes second conductive line 806*b* and second shielding layer 830 in second IMD layer 826. LC structure 800 includes conductive line 840*a*. Conductive line 840*a* is an embodiment of conductive line 740 shown in FIG. 7. In some embodiments, insulator 824 is used to electrically isolate conductive line 840*a* from substrate 820. In some embodiments, substrate 820 is connected to ground.

Figure 8B:
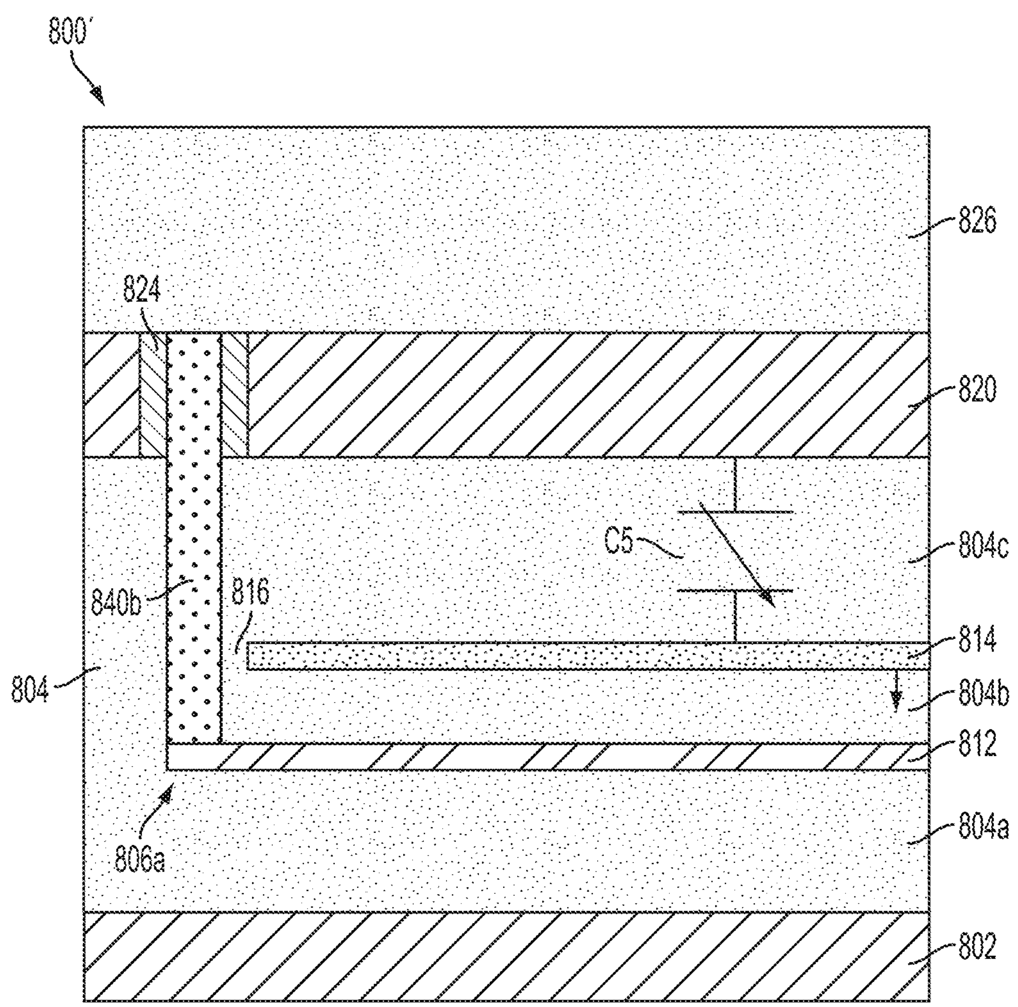
FIG. 8B is a cross sectional view of an LC transmission line structure in accordance with one or more embodiments.

FIG. 8B is a cross sectional view of an LC structure 800' in accordance with one or more embodiments. LC structure 800' is an embodiment of LC structure 700 (shown in FIG. 7) with similar elements. As shown in FIG. 8B, similar elements have a same reference number as shown in FIG. 7 increased by 100. In comparison with LC structure 700 (shown in FIG. 7), LC structure 800' does not include a second conductive line 806*b* and second shielding layer 830 in second IMD layer 826. LC structure 800' includes first conductive line 806*a* and first shielding layer 814 in first IMD layer 804. LC structure 800' includes conductive line 840*b*. Conductive line 840*b* is an embodiment of conductive line 740 shown in FIG. 7. In some embodiments, insulator 824 is used to electrically isolate conductive line 840*b* from substrate 820. In some embodiments, substrate 820 is connected to ground.

Figure 9B:
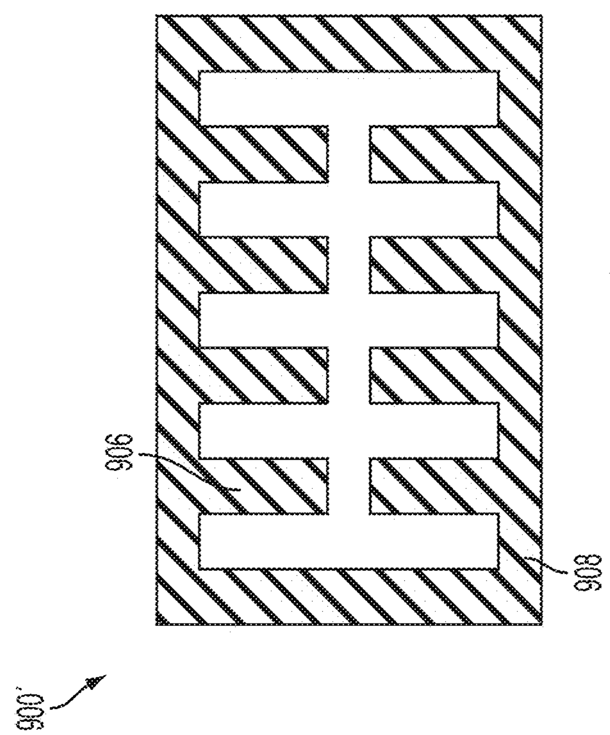
FIG. 9B is a top view of a shielding plate in accordance with one or more embodiments.
Figure 9A:
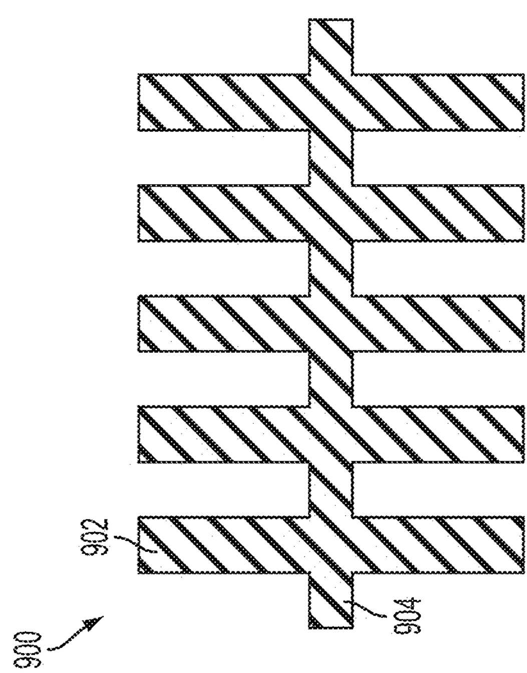
FIG. 9A is a top view of a shielding plate in accordance with one or more embodiments.

FIG. 9A is a top view of a shielding plate 900 in accordance with one or more embodiments. Shielding plate 900 is an embodiment of first shielding layer 114 shown in FIG. 1A and first shielding layer 314 shown in FIG. 3A. In some embodiments, shielding plate 900 of FIG. 9A is used in place of or in conjunction with the first shielding layer 114 shown in FIG. 1A and the first shielding layer 314 shown in FIG. 3A.

Shielding plate 900 includes one or more horizontal portions 904 which extend horizontally. In some embodiments, horizontal portions 904 are substantially parallel with other horizontal portions 904. Shielding plate 900 includes one or more vertical portions 902 which extend vertically. In some embodiments, vertical portions 904 are substantially parallel with other vertical portions 904. Shielding plate 900 includes one or more openings 906. In some embodiments, openings 906 extend in a substantially vertical direction. In some embodiments, openings 906 extend in a substantially horizontal direction. In some embodiments, openings 906 extend in a combination of a vertical and horizontal direction. In some embodiments, shielding plate 900 includes a solid conductor with openings 906, formed therein, shaped in various patterns, such as rectangular, square, circular, hexagonal, or other geometric shapes. In at least some embodiments, openings 906 are larger or smaller in size. In some embodiments, openings 906 provide protection from electromagnetic fields since they are small enough to reduce coupling at desired operating frequencies. In some embodiments, openings 906 are smaller than a wavelength for a corresponding frequency.

In some embodiments, shielding plate 900 is a multi-layer structure. In some embodiments, shielding plate 900 is a multi-layer structure which includes one or more shielding plates formed with the same patterns overlapping one another. In some embodiments, shielding plate 900 is a multi-layer structure which includes one or more shielding plates formed with different patterns overlapping one another. In some embodiments, shielding plate 900 is a multi-layer structure which includes one or more shielding plates which partially overlaps one another. In some embodiments, shielding plate 900 is a solid conductor with a plate-like shape. In some embodiments, shielding plate 900 is a single-layer structure.

FIG. 9B is a top view of a shielding plate 900' in accordance with one or more embodiments. Shielding plate 900' is an embodiment of first shielding layer 114 shown in FIG. 1A and first shielding layer 314 shown in FIG. 3A. In some embodiments, shielding plate 900' of FIG. 9B is used in place of or in conjunction with the first shielding layer 114 shown in FIG. 1A and the first shielding layer 314 shown in FIG. 3A.

Shielding plate 900' includes one or more horizontal portions 910 which extend horizontally. In some embodiments, horizontal portions 910 are substantially parallel with other horizontal portions 910. Shielding plate 900' includes one or more vertical portions 908 which extend vertically. In some embodiments, vertical portions 908 are substantially parallel with other vertical portions 908. Shielding plate 900' includes one or more openings 912. In some embodiments, openings 912 extend in a substantially vertical direction. In some embodiments, openings 912 extend in a substantially horizontal direction. In some embodiments, openings 912 extend in a combination of a vertical and horizontal direction. In some embodiments, shielding plate 900' includes a solid conductor with openings 912, formed therein, shaped in various patterns, such as rectangular, square, circular, hexagonal, or other geometric shapes. In at least some embodiments, openings 912 are larger or smaller in size. In some embodiments, openings 912 provide protection from electromagnetic fields since they are small enough to reduce coupling at desired operating frequencies. In some embodiments, openings 912 are smaller than a wavelength for a corresponding frequency.

In some embodiments, shielding plate 900' is a multi-layer structure. In some embodiments, shielding plate 900' is a multi-layer structure which includes one or more shielding plates formed with the same patterns overlapping one another. In some embodiments, shielding plate 900' is a multi-layer structure which includes one or more shielding plates formed with different patterns overlapping one another. In some embodiments, shielding plate 900' is a multi-layer structure which includes one or more shielding plates which partially overlaps one another. In some embodiments, shielding plate 900' is a solid conductor with a plate-like shape. In some embodiments, shielding plate 900' is a single-layer structure.

Figure 10:
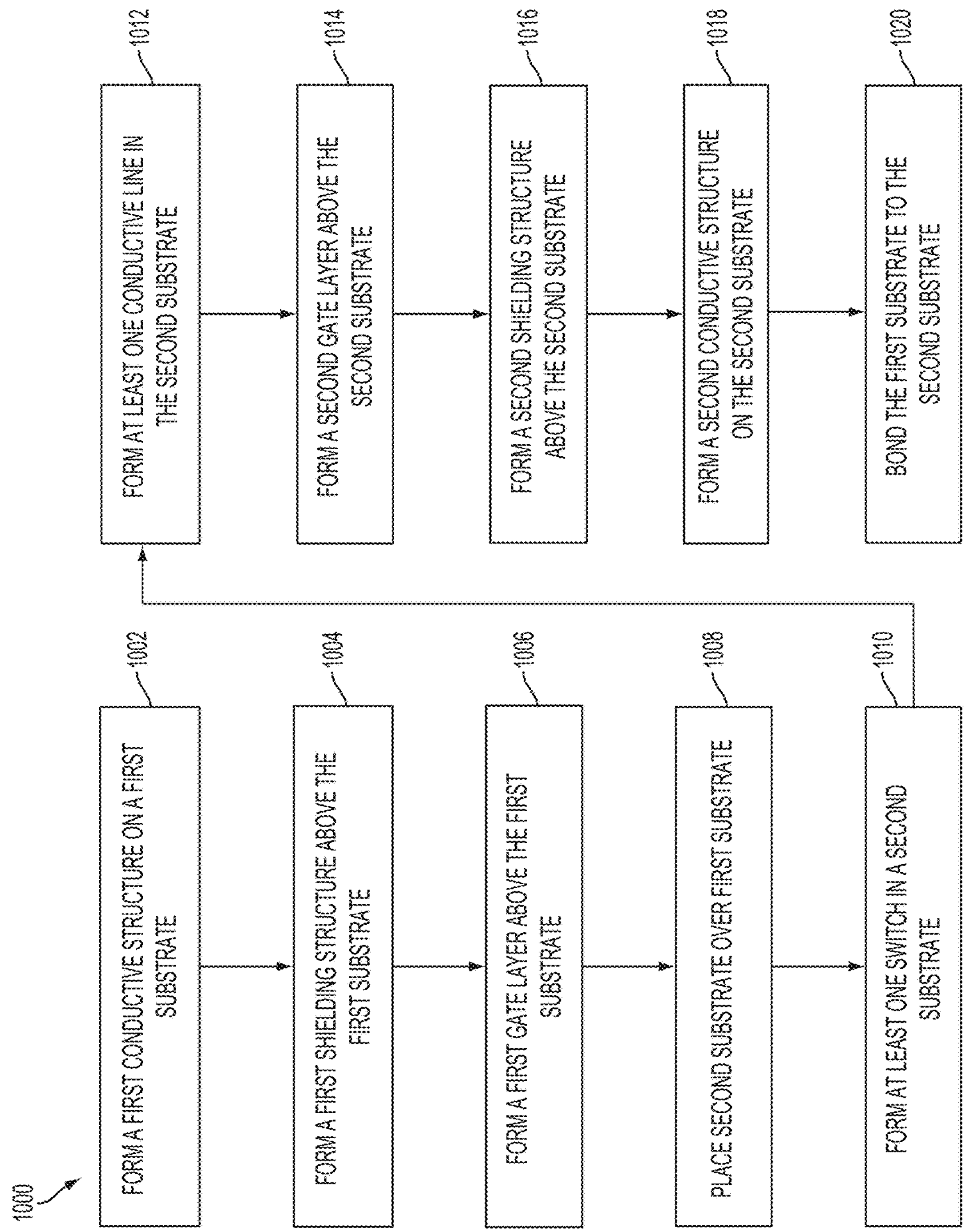
FIG. 10 is a flow chart of a method of making an LC structure in accordance with one or more embodiments.

FIG. 10 is a flow chart of a method 1000 of making an LC structure and an LC transmission line structure in accordance with one or more embodiments. Method 1000 begins with operation 1002 in which a first conductive structure, e.g., first conductive line 106*a* (FIG. 1A) or first conductive line 306*a* (FIG. 3A), is formed over a first substrate, e.g., first substrate 102 (FIG. 1A) or first substrate 302 (FIG. 3A). In some embodiments, the first conductive line is formed using a combination of photolithography and etching processes to form openings in an IMD layer, e.g., first IMD layer 104 (FIG. 1A) or first IMD layer 304 (FIG. 3A). In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the etching process is a wet etching process, a dry etching process, a reactive ion etching (RIE) process, or another suitable etching process. The openings are then filled with conductive material, e.g., copper, aluminum, titanium, nickel, tungsten, or other suitable conductive material. In some embodiments, the openings are filled using CVD, PVD, sputtering, atomic layer deposition (ALD) or other suitable formation process.

In some embodiments, operation 1002 is omitted. Operation 1002 is omitted, e.g., in embodiments which do not include a first conductive line between the first substrate and a second substrate, e.g., LC structure 200 and 600 (FIGS. 2A and 6A) and LC transmission line structure 400 and 800 (FIGS. 4A and 8A).

Method 1000 continues with operation 1004 in which first shielding structure, e.g., first shielding structure 114 (FIG. 1A) or first shielding structure 314 (FIG. 3A), is formed over the first substrate, e.g., first substrate 102 (FIG. 1A) or first substrate 302 (FIG. 3A). In some embodiments, the first shielding structure is formed using a combination of photolithography and etching processes to form openings in an IMD layer, e.g., first IMD layer 104 (FIG. 1A) or first IMD layer 304 (FIG. 3A). In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the etching process is a wet etching process, a dry etching process, an RIE process, or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In some embodiments, operation 1004 is omitted. Operation 1004 is omitted, e.g., in embodiments which do not include a first shielding layer between the first substrate and a second substrate, e.g., LC structure 200 and 600 (FIGS. 2A and 6A) and LC transmission line structure 400 and 800 (FIGS. 4A and 8A).

Method 1000 continues with operation 1006 in which first gate layer, e.g., first gate layer 118 (FIG. 1A) or first gate layer 318 (FIG. 3A), is formed over the first substrate, e.g., first substrate 102 (FIG. 1A) or first substrate 302 (FIG. 3A). In some embodiments, the first gate layer is formed using a doped or non-doped polycrystalline silicon (or polysilicon). Alternatively, the first gate layer includes a metal, such as Al, Cu, W, Ti, Ta, TiN, TaN, NiSi, CoSi, other suitable conductive materials, or combinations thereof, in some embodiments. In some embodiments, the first gate layer is formed using CVD, PVD, ALD, plating, or other suitable formation processes. In some embodiments, the first gate layer has a multilayer structure and is formed in a multiple-step process. Operation 1006 is omitted, e.g., in embodiments which do not include a first gate layer between the first substrate and a second substrate, e.g., LC structure 200 and 600 (FIGS. 2A and 6A) and LC transmission line structure 400 and 800 (FIGS. 4A and 8A).

Method 1000 continues with operation 1008 in which a second substrate, e.g., second substrate 120 (FIG. 1A) or second substrate 320 (FIG. 3A), is placed over the first substrate. In some embodiments, second substrate includes polysilicon, doped silicon, or other suitable conductive materials.

Method 1000 continues with operation 1010 in which at least one switch, e.g., switch 122 (FIG. 1A) or switch 322 (FIG. 3A), is formed in the second substrate, e.g., second substrate 120 (FIG. 1A) or second substrate 320 (FIG. 3A). In some embodiments, the at least one switch is a MOS, BJT, HEMT or another suitable switching element. In some embodiments, the at least one switch is formed through a combination of implantation processes, deposition process and etching processes. In some embodiments, operation 1010 is omitted when a switch is not utilized.

Method 1000 continues with operation 1012 in which at least one conductive line, e.g., conductive line 140 (FIG. 1A) or conductive line 340 (FIG. 3A), is formed in the second substrate. In some embodiments, the conductive line is formed using a combination of photolithography and material removal processes to form openings in the second substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process. In some embodiments, operation 1012 is omitted.

Method 1000 continues with operation 1014 in which second gate layer, e.g., second gate layer 128 (FIG. 1A) or second gate layer 328 (FIG. 3A), is formed over the second substrate, e.g., second substrate 120 (FIG. 1A) or second substrate 320 (FIG. 3A). In some embodiments, the second gate layer is formed using a doped or non-doped polycrystalline silicon (or polysilicon). Alternatively, the second gate layer includes a metal, such as Al, Cu, W, Ti, Ta, TiN, TaN, NiSi, CoSi, other suitable conductive materials, or combinations thereof, in some embodiments. In some embodiments, the second gate layer is formed using CVD, PVD, ALD, plating, or other suitable formation processes. In some embodiments, the second gate layer has a multilayer structure and is formed in a multiple-step process.

Operation 1014 is omitted, e.g., in embodiments which do not include a second gate layer over the first substrate and a second substrate, e.g., LC structure 200 and 600 (FIGS. 2B and 6B) and LC transmission line structure 400 and 800 (FIGS. 4B and 8B).

Method 1000 continues with operation 1016 in which second shielding structure, e.g., second shielding structure 130 (FIG. 1A) or second shielding structure 330 (FIG. 3A), is formed on the second substrate, e.g., second substrate 120 (FIG. 1A) or second substrate 320 (FIG. 3A). In some embodiments, the second shielding structure is formed using a combination of photolithography and etching processes to form openings in an IMD layer, e.g., second IMD layer 126 (FIG. 1A) or second IMD layer 326 (FIG. 3A). In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the etching process is a wet etching process, a dry etching process, an RIE process, or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In some embodiments, operation 1016 is omitted. Operation 1016 is omitted, e.g., in embodiments which do not include a second shielding layer above the first substrate and second substrate, e.g., LC structure 200 and 600 (FIGS. 2B and 6B) and LC transmission line structure 400 and 800 (FIGS. 4B and 8B).

Method 1000 continues with operation 1018 in which a second conductive structure, e.g., second conductive line 106*b* (FIG. 1A) or second conductive line 306*b* (FIG. 3A), is formed on a second substrate, e.g., second substrate 120 (FIG. 1A) or second substrate 320 (FIG. 3A). In some embodiments, the second conductive line is formed using a combination of photolithography and etching processes to form openings in an IMD layer, e.g., second IMD layer 126 (FIG. 1A) or second IMD layer 326 (FIG. 3A). In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the etching process is a wet etching process, a dry etching process, an RIE process, or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

In some embodiments, operation 1018 is omitted. Operation 1018 is omitted, e.g., in embodiments which do not include a second conductive line above the first substrate and second substrate, e.g., LC structure 200 and 600 (FIGS. 2B and 6B) and LC transmission line structure 400 and 800 (FIGS. 4B and 8B).

Method 1000 continues with operation 1020 in which the first substrate is bonded to the second substrate. In some embodiments, the first substrate is bonded to the second substrate using a laser bonding process, a conductive adhesive layer, soldering process or another suitable bonding process.

One of ordinary skill in the art would recognize that an order of operations in method 1000 is adjustable. One of ordinary skill in the art would further recognize that additional steps are able to be included in method 1000 without departing from the scope of this description.

One aspect of this description relates to an inductive capacitive structure including a first substrate, a first conductive line over the first substrate, a first shielding layer over the first substrate and a second substrate over the first substrate.

Another aspect of this description relates to an inductive capacitive structure including a first substrate, a second substrate over the first substrate, a first conductive line over the second substrate and a first shielding layer over the second substrate.

Still another aspect of this description relates to a method of making an inductive capacitive structure, the method including forming a first conductive structure over one of a first substrate or a second substrate, forming a first shielding structure over one of the first substrate or the second substrate and bonding the second substrate to the first substrate.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An inductive capacitive structure comprising:
a first substrate;
a first conductive line over the first substrate;
a first shielding layer over the first substrate;
a second substrate over the first substrate;
a first gate layer between the first substrate and the second substrate; and
a second shielding layer over the second substrate.

2. The inductive capacitive structure of claim 1, wherein the first conductive line comprises a meandering conductive line.

3. The inductive capacitive structure of claim 1, further comprising a second conductive line on an opposite side of the second substrate from the first conductive line.

4. The inductive capacitive structure of claim 3, further comprising an inter level via configured to electrically connect the first conductive line to the second conductive line through the second substrate.

5. The inductive capacitive structure of claim 3, further comprising at least one switch in the second substrate, wherein the at least one switch is configured to selectively connect the first conductive line to the second conductive line.

6. The inductive capacitive structure of claim 1, further comprising:
a first inter metal dielectric (IMD) layer between the first substrate and the second substrate; and
a second IMD layer over the second substrate, wherein the first conductive line is in the first IMD layer.

7. The inductive capacitive structure of claim 1, wherein the first conductive line is between the first substrate and the second substrate.

8. The inductive capacitive structure of claim 1, wherein the first conductive line is a portion of an inductive device.

9. The inductive capacitive structure of claim 1, further comprising a second gate layer between the second substrate and the second shielding layer.

10. An inductive capacitive structure comprising:
a first substrate;
a second substrate over the first substrate;
a first gate layer over the second substrate;
a first conductive line over the second substrate; and
a first shielding layer over the second substrate.

11. The inductive capacitive structure of claim 10, wherein the first conductive line comprises a meandering conductive line.

12. The inductive capacitive structure of claim 10, wherein the first shielding layer is between the first conductive line and the second substrate.

13. The inductive capacitive structure of claim 10, wherein the first gate layer is between the first conductive line and the second substrate.

14. The inductive capacitive structure of claim 10, further comprising:
a second conductive line on an opposite side of the second substrate from the first conductive line; and
a second shielding layer on the opposite side of the second substrate from the first conductive line.

15. The inductive capacitive structure of claim 14, further comprising a second gate layer, wherein the second gate layer is between the second conductive line and the first substrate.

16. The inductive capacitive structure of claim 14, further comprising an inter level via configured to electrically connect the first conductive line to the second conductive line through the second substrate.

17. The inductive capacitive structure of claim 10, wherein the first conductive line is a portion of an inductive device.

18. A method of making an inductive capacitive structure, the method comprising:

forming a first conductive structure over one of a first substrate or a second substrate, wherein the first conductive structure is an inductor or a transmission line;

forming a first shielding structure over one of the first substrate or the second substrate;

forming a first gate layer over one of the first substrate or the second substrate;

forming a second shielding structure over the other of the first substrate or the second substrate; and bonding the second substrate to the first substrate.

19. The method of claim 18, further comprising:

forming a second conductive structure over one of the first substrate or the second substrate; and forming an inter level via in the second substrate electrically connecting the first conductive structure to the second conductive structure.

20. The method of claim 18, forming a second gate layer over the other of the first substrate or the second substrate.

* * * * *